US012068378B2

(12) United States Patent
Huang et al.

(10) Patent No.: US 12,068,378 B2
(45) Date of Patent: Aug. 20, 2024

(54) SEMICONDUCTOR DEVICES WITH BACKSIDE VIA AND METHODS THEREOF

(71) Applicant: Taiwan Semiconductor Manufacturing Company, Ltd., Hsin-Chu (TW)

(72) Inventors: Po-Yu Huang, Hsinchu (TW); Chen-Ming Lee, Taoyuan County (TW); I-Wen Wu, Hsinchu (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/360,085

(22) Filed: Jul. 27, 2023

(65) Prior Publication Data

US 2023/0387226 A1    Nov. 30, 2023

Related U.S. Application Data

(62) Division of application No. 17/245,232, filed on Apr. 30, 2021, now Pat. No. 11,791,387.

(51) Int. Cl.
| *H01L 29/417* | (2006.01) |
| *H01L 21/768* | (2006.01) |
| *H01L 23/522* | (2006.01) |
| *H01L 29/40* | (2006.01) |

(52) U.S. Cl.
CPC .... *H01L 29/4175* (2013.01); *H01L 21/76802* (2013.01); *H01L 21/76877* (2013.01); *H01L 23/5226* (2013.01); *H01L 29/401* (2013.01); *H01L 29/41733* (2013.01); *H01L 29/41775* (2013.01)

(58) Field of Classification Search
None
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |

(Continued)

*Primary Examiner* — Evren Seven
*Assistant Examiner* — Cole Leon Lindsey
(74) *Attorney, Agent, or Firm* — HAYNES AND BOONE, LLP

(57) ABSTRACT

A semiconductor structure and a method of forming the same are provided. In an embodiment, an exemplary semiconductor structure includes a gate structure disposed over a channel region of an active region, a drain feature disposed over a drain region of the active region; a source feature disposed over a source region of the active region, a backside source contact disposed under the source feature, an isolation feature disposed on and in contact with the source feature, a drain contact disposed over and electrically coupled to the drain feature, and a gate contact via disposed over and electrically coupled to the gate structure. A distance between the gate contact via and the drain contact is greater than a distance between the gate contact via and the isolation feature. The exemplary semiconductor structure would have a reduced parasitic capacitance and an enlarged leakage window.

20 Claims, 39 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,199,502 B2 | 2/2019 | Huang et al. |
| 11,282,839 B2 | 3/2022 | Kim et al. |
| 2020/0006230 A1 | 1/2020 | Tsai et al. |
| 2020/0161439 A1 | 5/2020 | You et al. |
| 2020/0373301 A1* | 11/2020 | Kim ................ H01L 29/0847 |
| 2021/0134721 A1 | 5/2021 | Chiang et al. |
| 2021/0305381 A1* | 9/2021 | Chiang ............ H01L 29/78696 |

* cited by examiner

SEMICONDUCTOR DEVICES WITH BACKSIDE VIA AND METHODS THEREOF

PRIORITY DATA

This application is a divisional of U.S. patent application Ser. No. 17/245,232, filed Apr. 30, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, aggressive scaling down of IC dimensions has resulted in densely spaced source/drain features and gate structures, and densely spaced source/drain contacts and gate contact vias. A reduced space between two adjacent conductive features (e.g., gate contact via and source/drain contact) may lead to current leakage, which also increases power consumption and if sufficiently large can also cause complete circuit failure. Thus, although existing techniques are generally adequate for their intended purposes, they are not entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
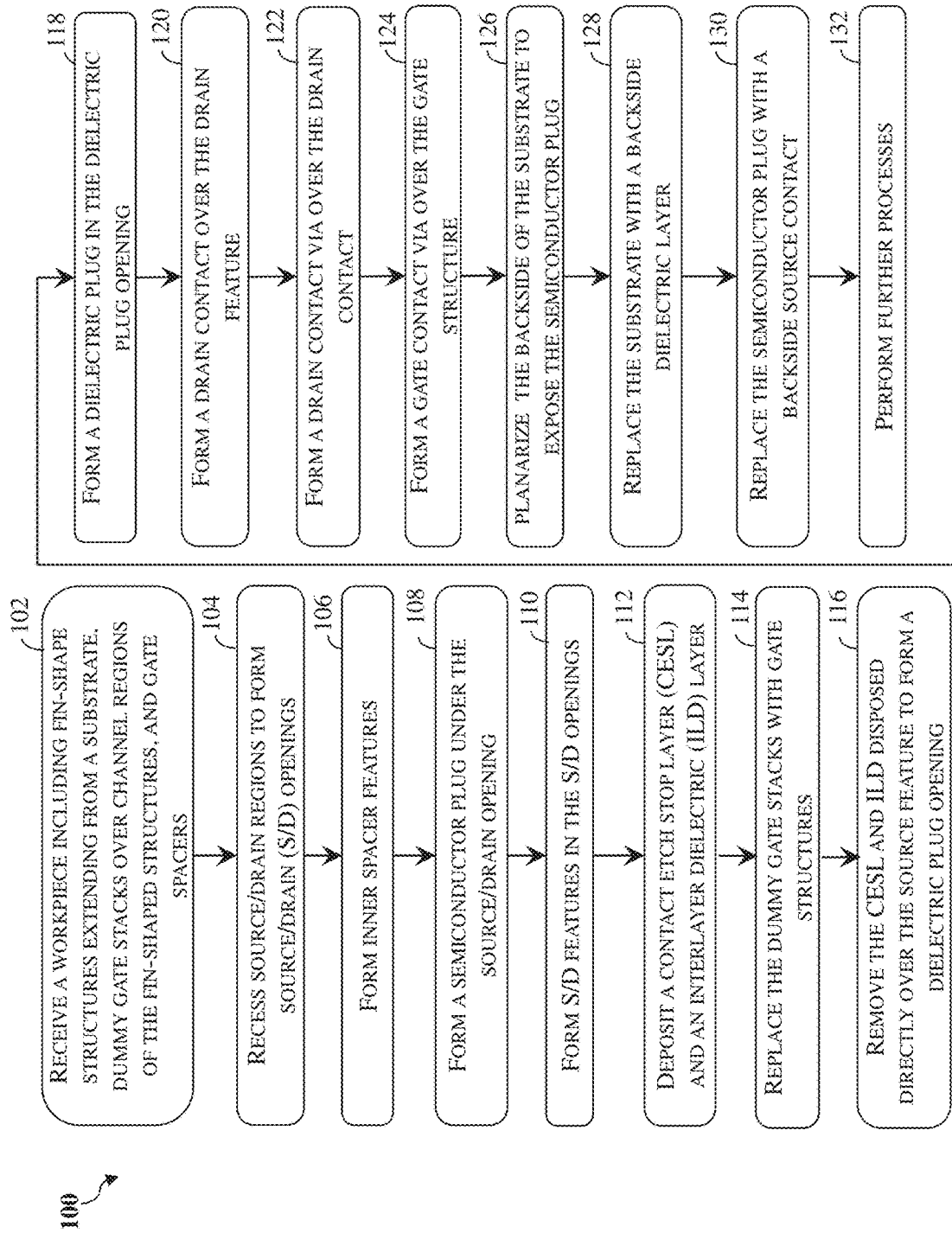
FIG. 1 illustrates a flow chart of an exemplary method for forming a semiconductor device having a backside power rail, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as fin field-effect transistors (FinFETs) and multi-bridge-channel (MBC) transistors, have been introduced in an effort to improve gate control by increasing gate-channel coupling, reduce OFF-state current, and reduce short-channel effects (SCEs). A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. The three-dimensional structure of the multi-gate devices, allows them to be aggressively scaled while maintaining gate control and mitigating SCEs.

As described above, aggressive scaling down of IC dimensions has resulted in densely spaced transistors, which would result in densely spaced middle-end-of-line features (MEOL). MEOL generally encompasses processes related to fabricating contacts to conductive features (or conductive regions) of the IC devices, such as contacts to the source/drain features. The challenges in fabricating densely spaced MEOL features may limit increase in transistor density. The close proximity among the source/drain contacts and gate contact vias may also increase parasitic capacitance among them and may lead to current leakage.

The present disclosure provides semiconductor devices and methods for introducing an isolation feature on a source/drain feature instead of forming a frontside source/drain contact. An exemplary semiconductor device includes a first source/drain feature disposed over a backside source/drain contact, a second source/drain feature, a gate structure disposed over and between the first and second source/drain features, a bottom dielectric layer disposed directly over the second source/drain feature, a first dielectric layer disposed over the bottom dielectric layer, and an isolation feature extending through the first dielectric layer and disposed directly on the first source/drain feature. A composition of the isolation feature is different than a composition of the bottom dielectric layer, and the first source/drain feature is spaced apart from the first dielectric layer by the isolation feature. By forming an isolation feature over the source feature rather than forming a frontside source contact, a potential leakage current path and a parasitic capacitance between the frontside source contact and the gate via may be substantially eliminated. Forming the isolation feature on the source feature would also increase the design flexibility of the gate contact via, thereby enlarging a leakage window (i.e., reduce or substantially eliminate a leakage) between the gate contact via and a metal contact over the frontside drain contact, and/or reducing a parasitic resistance associated with the gate contact via.

The various aspects of the present disclosure will now be described in more detail with reference to the figures. In that regard, FIG. 1 is a flow chart illustrating method 100 of forming a semiconductor device. FIG. 27 is a flow chart illustrating method 300 for determining a configuration of a gate contact via to be fabricated in the method of FIG. 1. Method 100 and method 300 are described below in conjunction with FIGS. 2-26 and 28-39. Method 100 and 300 are merely examples and are not intended to limit the present disclosure to what is explicitly illustrated therein. Additional steps may be provided before, during, and/or after the method 100 and method 300, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-26 and 28-39 are perpendicular to one another and are used consistently throughout FIGS. 2-26 and 28-39. Throughout the present disclosure, like reference numerals denote like features unless otherwise excepted.

Figure 2:
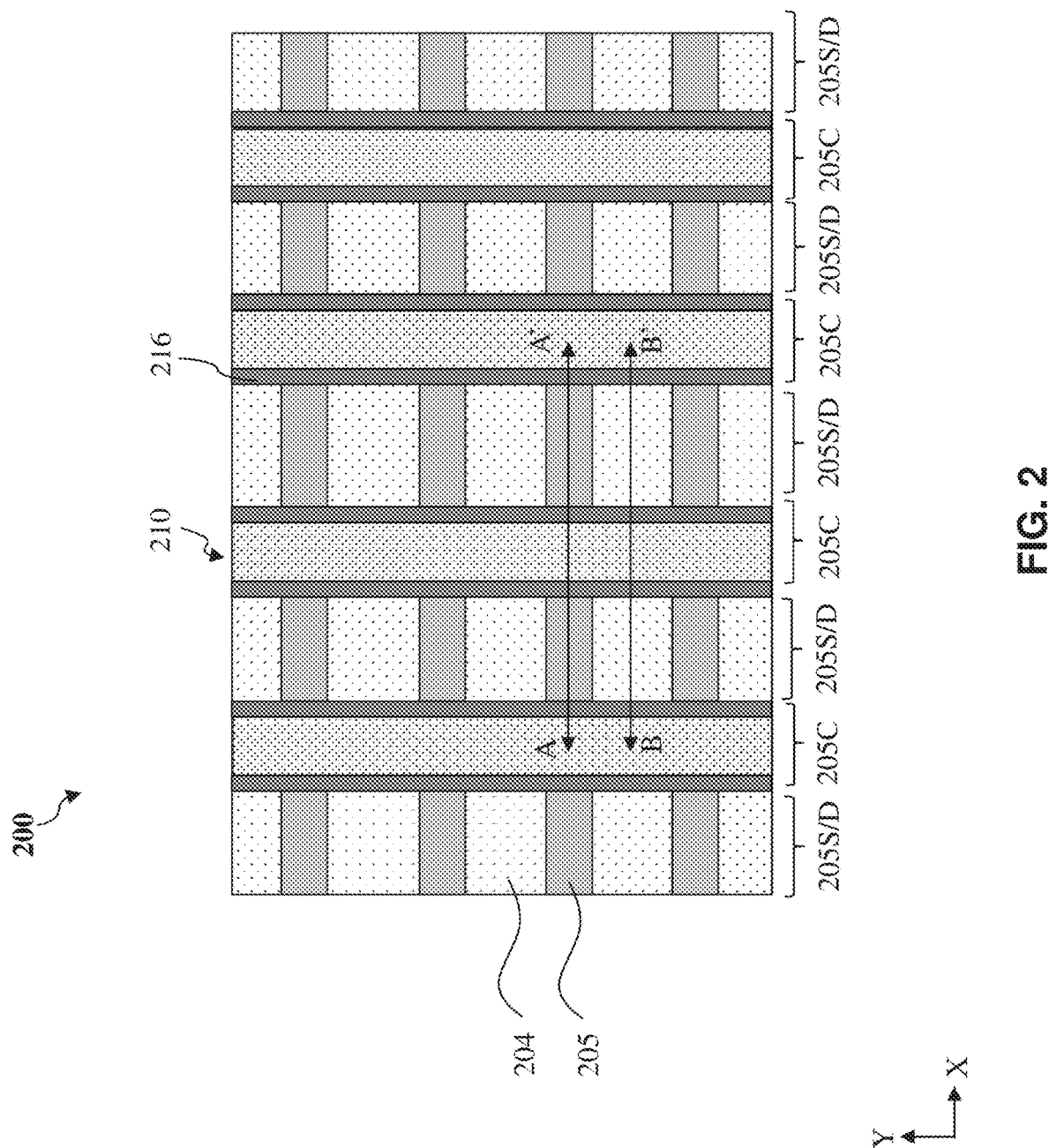
FIG. 2 illustrates a fragmentary top view of an exemplary workpiece to undergo various stages of operations in the method of FIG. 1, according to various aspects of the disclosure.
Figure 3:
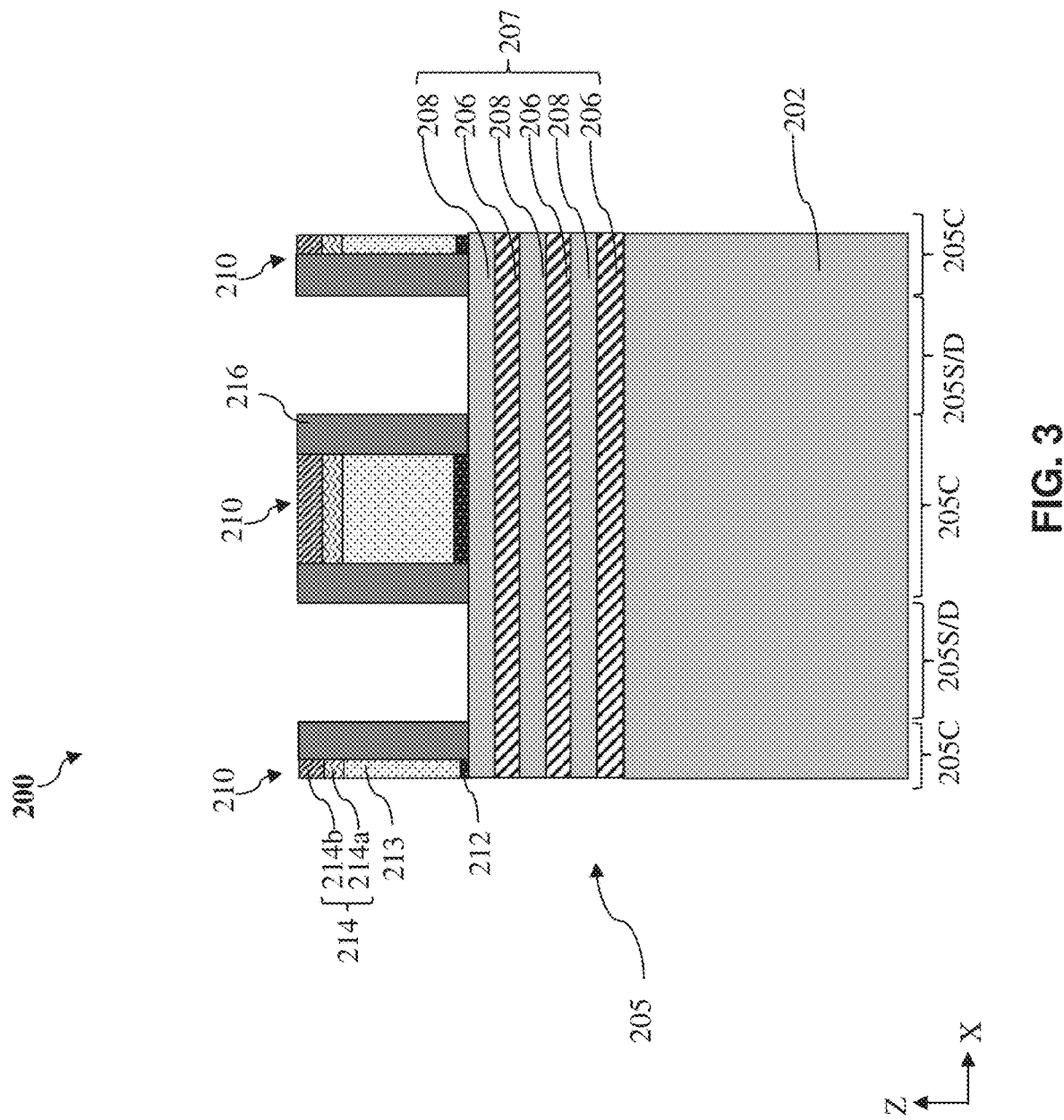
FIGS. 3-16 illustrate fragmentary cross-sectional views of an exemplary workpiece taken along line A-A' as shown in FIG. 2 during various fabrication stages in the method of FIG. 1, according to one or more aspects of the present disclosure.

Referring to FIGS. 1-3, method 100 includes a block 102 where a workpiece 200 is received. FIG. 2 depicts a fragmentary top view of an exemplary workpiece 200. FIG. 3 depicts a fragmentary cross-sectional view of the exemplary workpiece 200 taken along line A-A' as shown in FIG. 2. As shown in FIGS. 2-3, the workpiece 200 includes a substrate 202. In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods.

As shown in FIGS. 2-3, the workpiece 200 also includes a number of fin-shaped structures 205 disposed over the substrate 202. The fin-shaped structure 205 may be formed from a portion of the substrate 202 and a vertical stack 207 of alternating semiconductor layers 206 and 208. In the depicted embodiment, the vertical stack 207 may include a plurality of channel layers 208 interleaved by a plurality of sacrificial layers 206. Each of the channel layers 208 may be formed of silicon and each of the sacrificial layers 206 may be formed of silicon germanium. The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. The fin-shaped structure 205 extends lengthwise along the X direction and is divided into channel regions 205C overlapped by dummy gate stacks 210, source regions 205S/D, and drain regions 205S/D. Each of the channel regions 205C is disposed between a source region 205S/D and a drain region 205S/D along the X direction. In this embodiment, a gate replacement process (or gate-last process) is adopted where the dummy gate stacks 210 serve as placeholders for functional gate structures. Other processes and configuration are possible. Suitable deposition process, photolithography and etching process may be employed to form the dummy gate stack 210. As shown in FIG. 3, the dummy gate stack 210 includes a dummy dielectric layer 212, a dummy gate electrode layer 213 over the dummy dielectric layer 212, and a gate-top hard mask layer 214 over the dummy gate electrode layer 213. In an embodiment, the dummy dielectric layer 212 includes silicon oxide. The dummy gate electrode layer 213 includes polysilicon, the gate-top hard mask layer 214 includes a silicon nitride layer 214b formed on a silicon oxide layer 214a.

Still referring to FIGS. 2-3, the workpiece 200 also includes an isolation structure 204 formed around the fin-shaped structure 205 to isolate the fin-shaped structure 205 from an adjacent fin-shaped structure. In some embodiments, the isolation structure 204 is deposited in trenches that define the fin-shaped structure 205. Such trenches may extend through the channel layers 208 and sacrificial layers 206 and terminate in the substrate 202. The isolation structure 204 may also be referred to as a shallow trench isolation (STI) feature. The isolation structure 204 may include silicon oxide, silicon oxynitride, fluorine-doped silicate glass (FSG), a low-k dielectric, combinations thereof, and/or other suitable materials.

Still referring to FIGS. 2-3, the workpiece 200 also includes gate spacers 216 formed along the sidewalls of the dummy gate stacks 210. In some embodiments, the gate spacers 216 may include silicon oxycarbide, silicon carbonitride, silicon nitride, silicon carbon oxynitride, zirconium oxide, aluminum oxide, or a suitable dielectric material.

Figure 4:
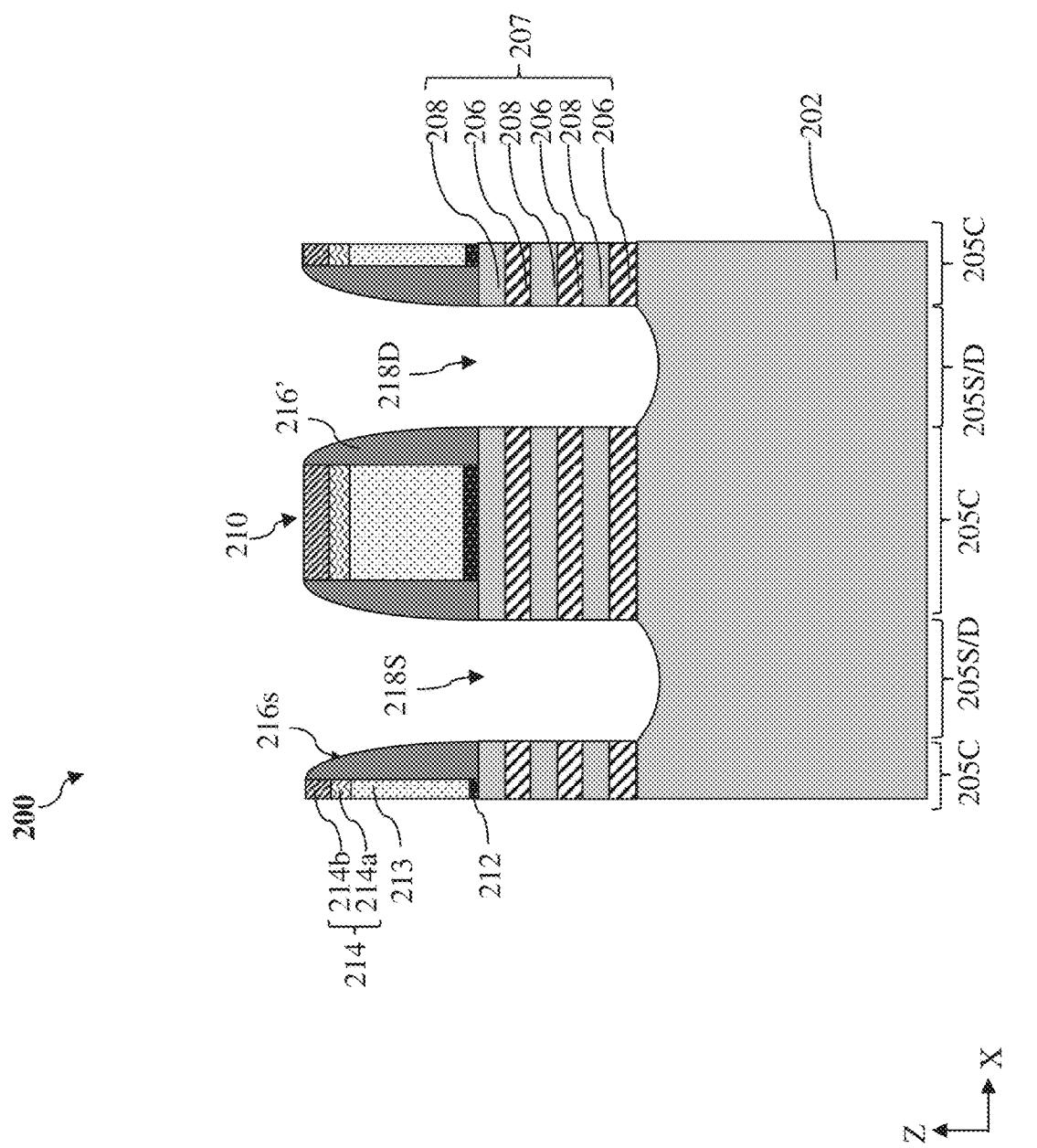

Referring to FIGS. 1 and 4, method 100 includes a block 104 where a first source/drain region 205S/D and a second source/drain region 205S/D are recessed to form a source opening 218S and a drain opening 218D. The source region 205S/D and drain region 205S/D of the fin-shaped structures 205 that are not covered by the dummy gate stack 210 and the gate spacer 216 are anisotropically etched by a dry etching process or a suitable etching process. The dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 4, the source opening 218S and drain opening 218D extend through the vertical stack 207 and may partially extend into the substrate 202. During the formation of the source and drain openings 218S-218D, the gate spacers 216 are slightly etched. The slightly etched gate spacer 216 may be referred to as gate spacers 216'. Each gate spacer 216' includes a sidewall 216s curved outwards and has a width (dimension along the X direction) gradually reduces along the Z direction.

Figure 5:
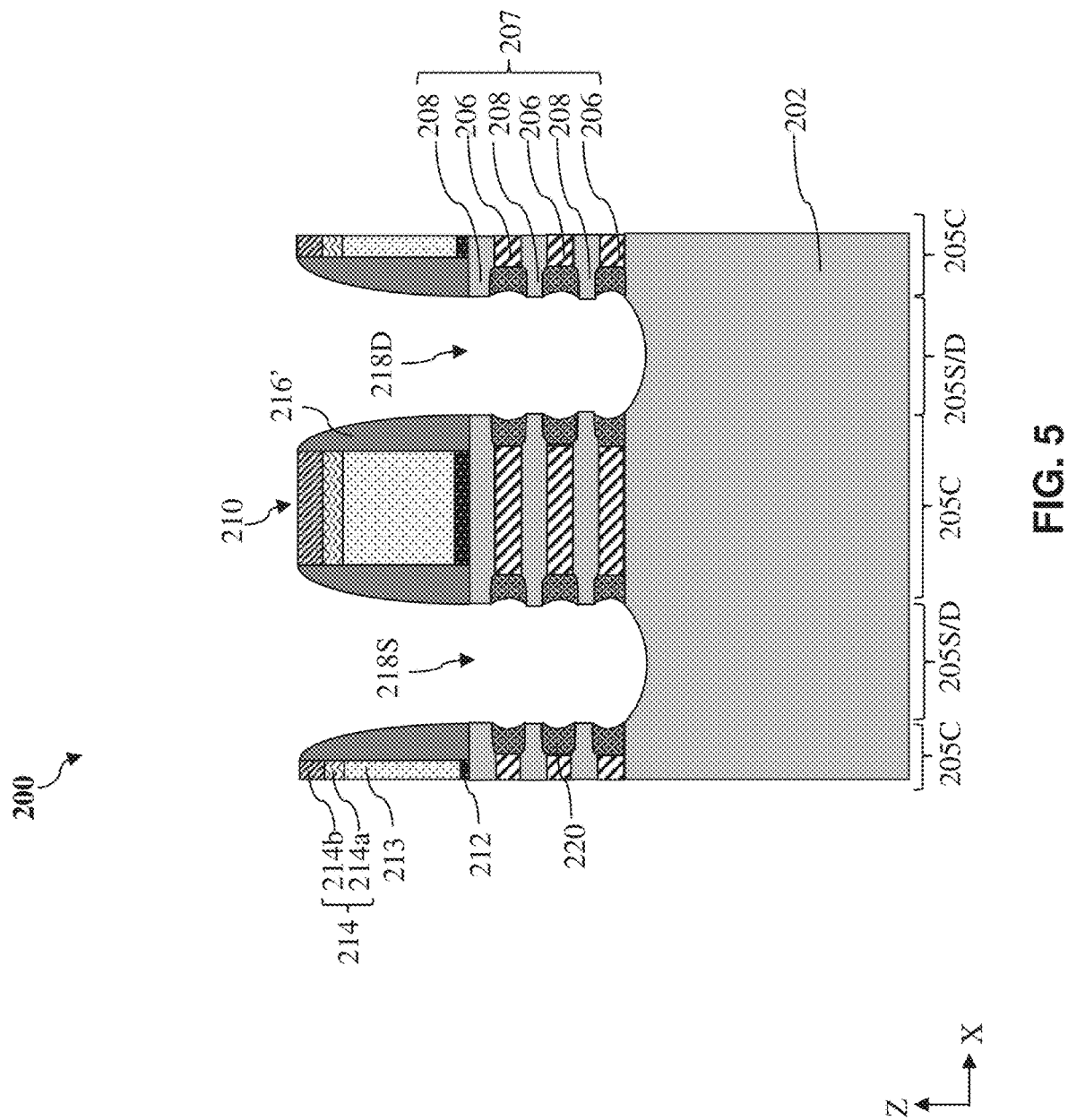

Referring to FIGS. 1 and 5, method 100 includes a block 106 where inner spacer features 220 are formed. After the sacrificial layers 206 are exposed in the source and drain openings 218S-218D, the sacrificial layers 206 may be selectively and partially recessed to form inner spacer recesses (filled by inner spacer features 220) while the exposed channel layers 208 are not significantly etched. In an embodiment where the channel layers 208 consist essentially of silicon and sacrificial layers 206 consist essentially of silicon germanium, the selective and partial recess of the sacrificial layers 206 may include use of a selective isotropic etching process. After the formation of the inner spacer recesses, an inner spacer material layer is deposited over the workpiece 200 to fill the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excessive inner spacer material layer over sidewalls of the channel layers 208, thereby forming the inner spacer features 220. In some embodiments, the etch back process at block 106 may be a dry etching process and in a way similar to the dry etching process used in the formation of the source and drain openings 218S-218D.

Figure 6:
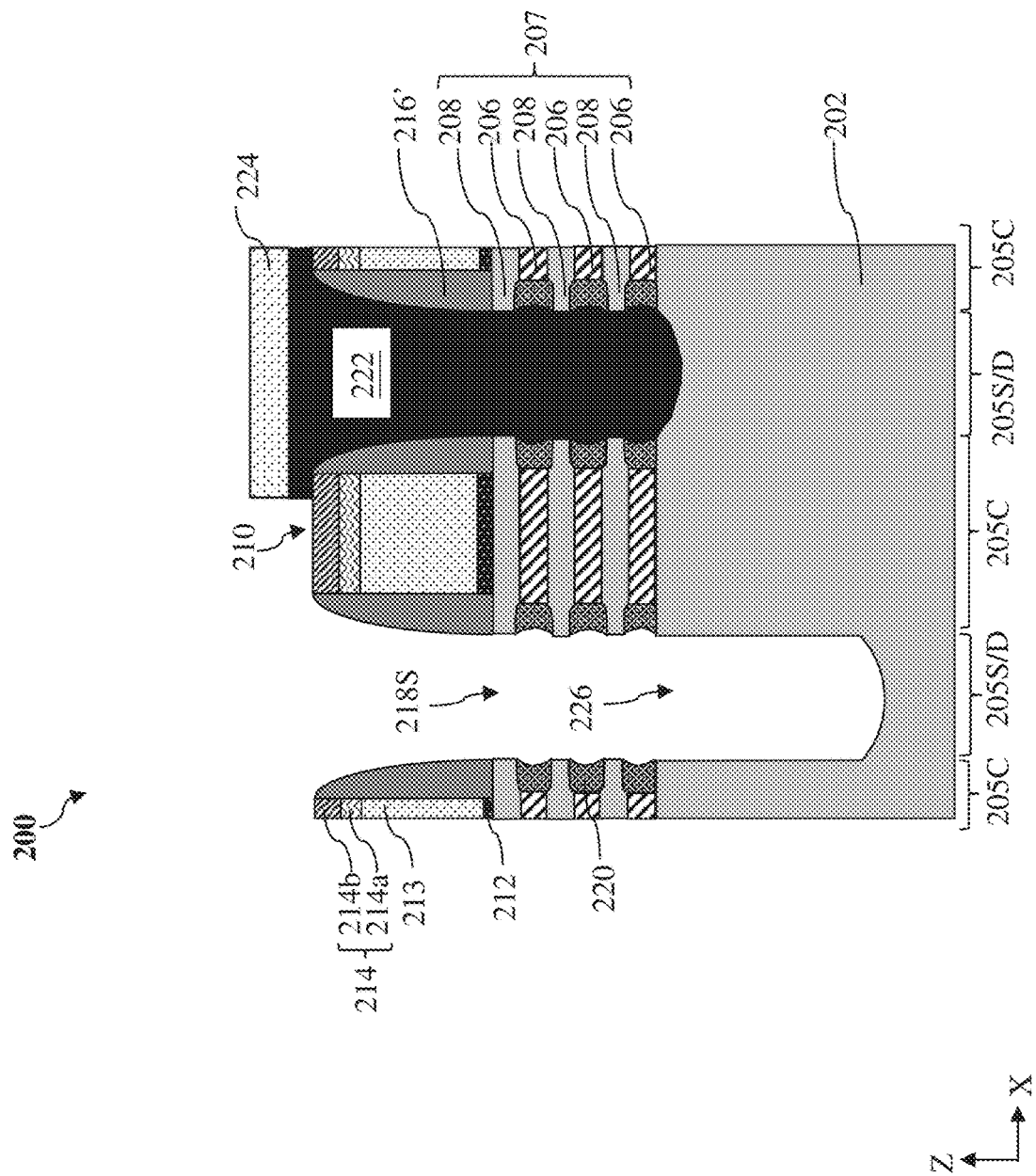
Figure 7:
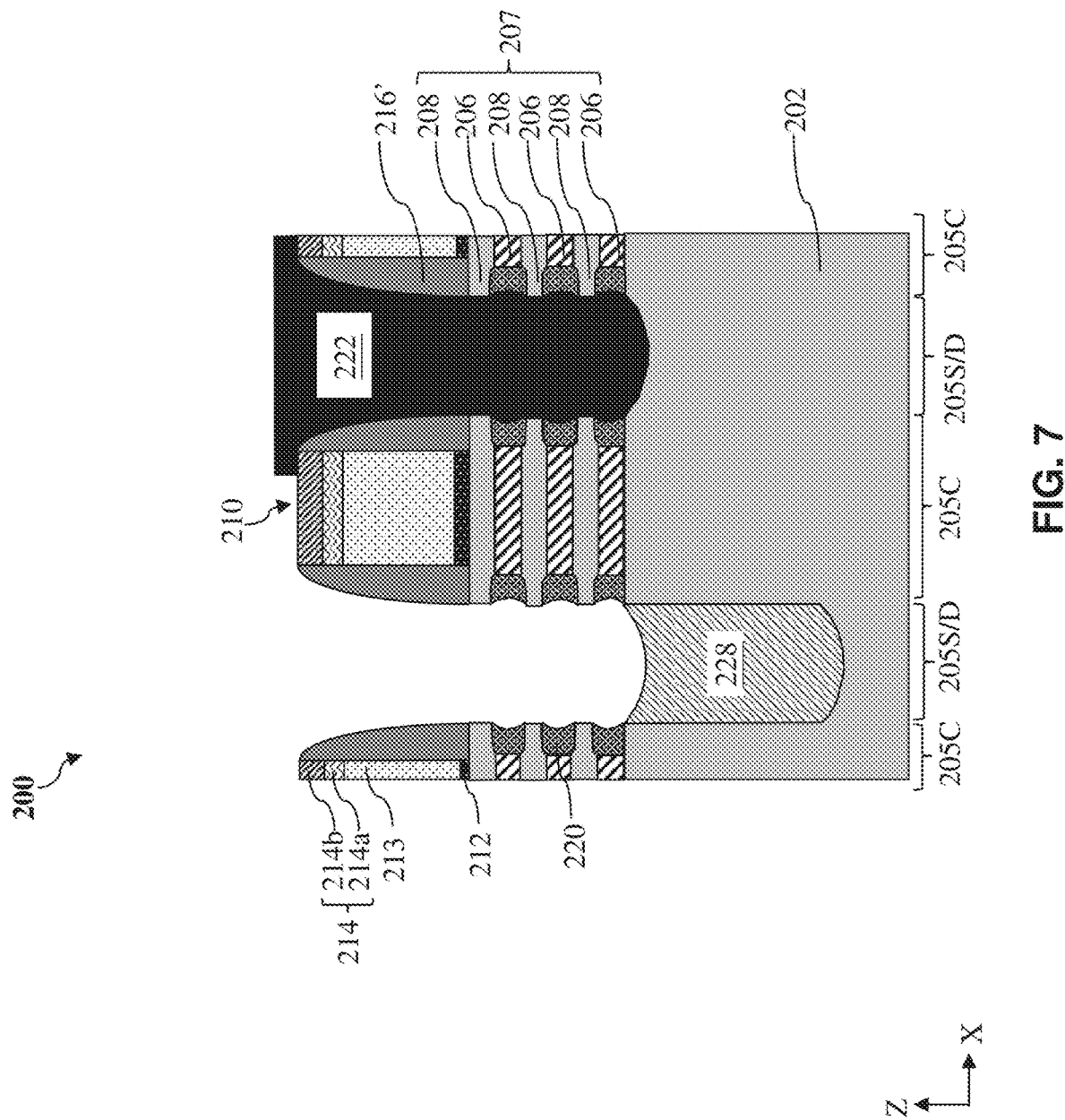

Referring to FIGS. 1 and 6-7, method 100 includes a block 108 where a semiconductor plug 228 is formed under the source opening 218S. In some embodiments, a mask film 222 is deposited over the workpiece 200 and then a photoresist layer 224 is deposited over the mask film 222. In some embodiments, the mask film 222 may be a bottom anti-reflective coating (BARC) layer. The photoresist layer 224 is patterned and then applied as an etch mask in an etching process to pattern the mask film 222. As shown in FIG. 6, the patterned photoresist layer 224 and the patterned mask film 222 cover/protect the drain opening 218D while the source opening 218S is exposed. An etching process is then performed to extend the source opening 218S into the substrate 202 to form an extended opening 226. In some implementations, the etching process at block 108 may be a dry etching process and in a way similar to the dry etching process used in the formation of the source and drain openings 218S-218D. The patterned photoresist layer 224 may be then removed.

With the mask film 222 still covering the drain opening 218D, the semiconductor plug 228 may be selectively formed in the extended opening 226 using MBE, VPE, UHV-CVD, and/or other suitable epitaxial growth processes. The composition of the semiconductor plug 228 is different than that of the substrate 202 such that the substrate 202 may be selectively removed in a subsequent process. For example, when the substrate 202 is formed of silicon, the semiconductor plug 228 may include undoped SiGe, boron-doped silicon (Si:B), phosphorus-doped silicon (Si:P), boron-doped SiGe (SiGe:B), arsenic-doped silicon (Si:As) or other suitable material such that the substrate 202 may be selectively removed without substantially etching the semiconductor plug 228. In an embodiment, the substrate 202 is formed of silicon and the semiconductor plug 228 is formed of undoped SiGe. After the formation of the semiconductor plug 228, the mask film 222 covering the drain opening 218D is selectively removed using a suitable etching process.

Figure 8:
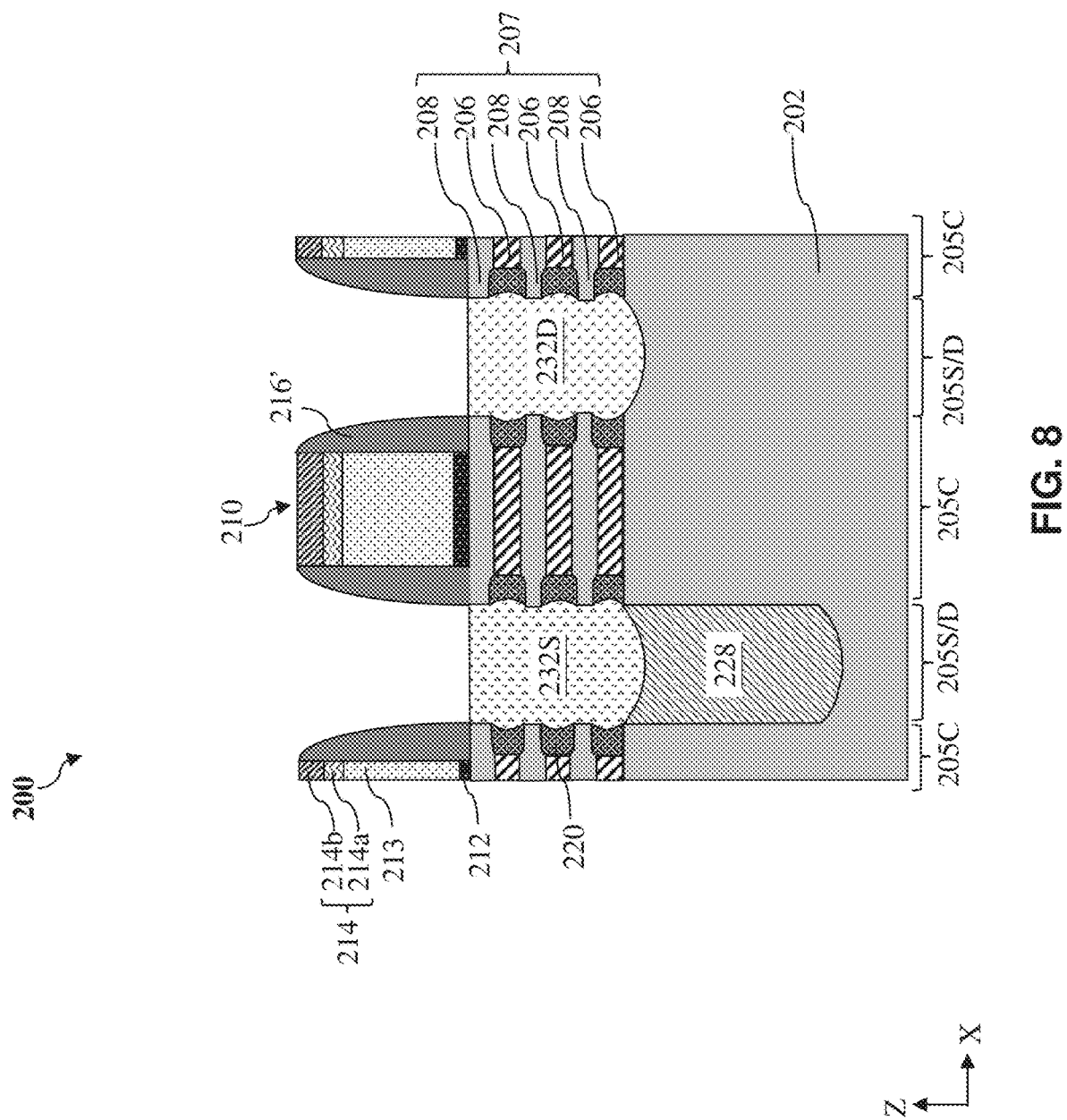

Referring to FIGS. 1 and 8, method 100 includes a block 110 where a source feature 232S is formed in the source opening 218S and a drain feature 232D is formed in the drain opening 218D. The source feature 232S and the drain feature 232D each may be formed using an epitaxial process, such as VPE, UHV-CVD, MBE, and/or other suitable processes. The source feature 232S and the drain feature 232D are therefore coupled to the channel layers 208 in the channel regions 205C of the fin-shape structure 205. Depending on the conductivity type of the to-be-formed transistor, the source feature 232S and the drain feature 232D may be n-type or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Figure 9:
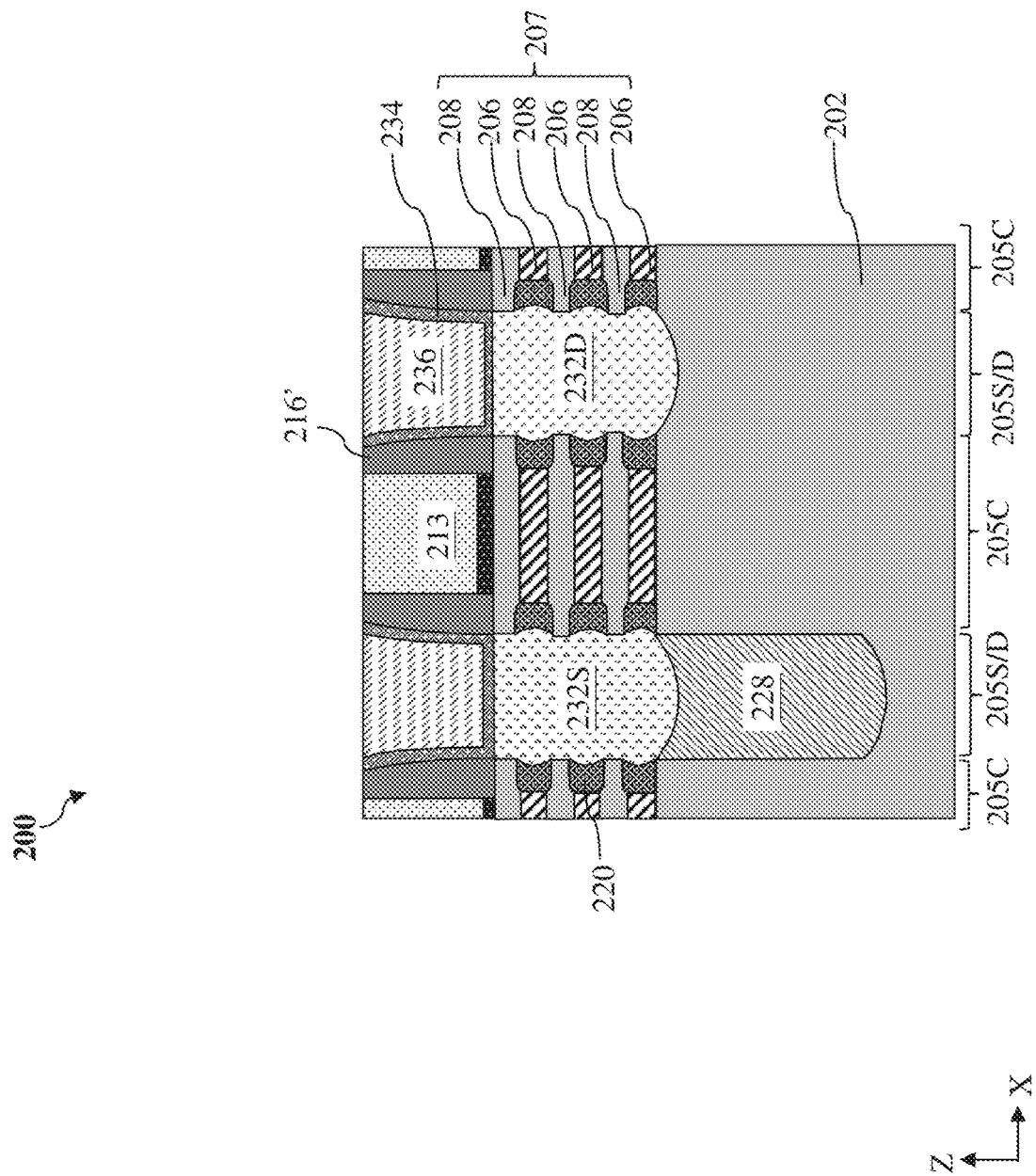

Referring to FIGS. 1 and 9, method 100 includes a block 112 where a contact etch stop layer (CESL) 234 and a bottom interlayer dielectric (ILD) layer 236 are deposited over the workpiece 200. The CESL 234 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 9, the CESL 234 may be conformally deposited on the top surface of the source feature 232S, the top surface of the drain feature 232D, and sidewalls of the gate spacers 216. The bottom ILD layer 236 is deposited by a PECVD process or other suitable deposition technique over the workpiece 200 after the deposition of the CESL 234. The composition of the bottom ILD layer 236 is different than that of the gate spacer 216' such that the bottom ILD layer 236 may be selectively removed in a subsequent process. The bottom ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A planarization process, such a chemical mechanical polishing (CMP) process may be performed to remove excessive materials and expose top surfaces of the dummy gate electrode layer 213 in the dummy gate stacks 210.

Figure 10:
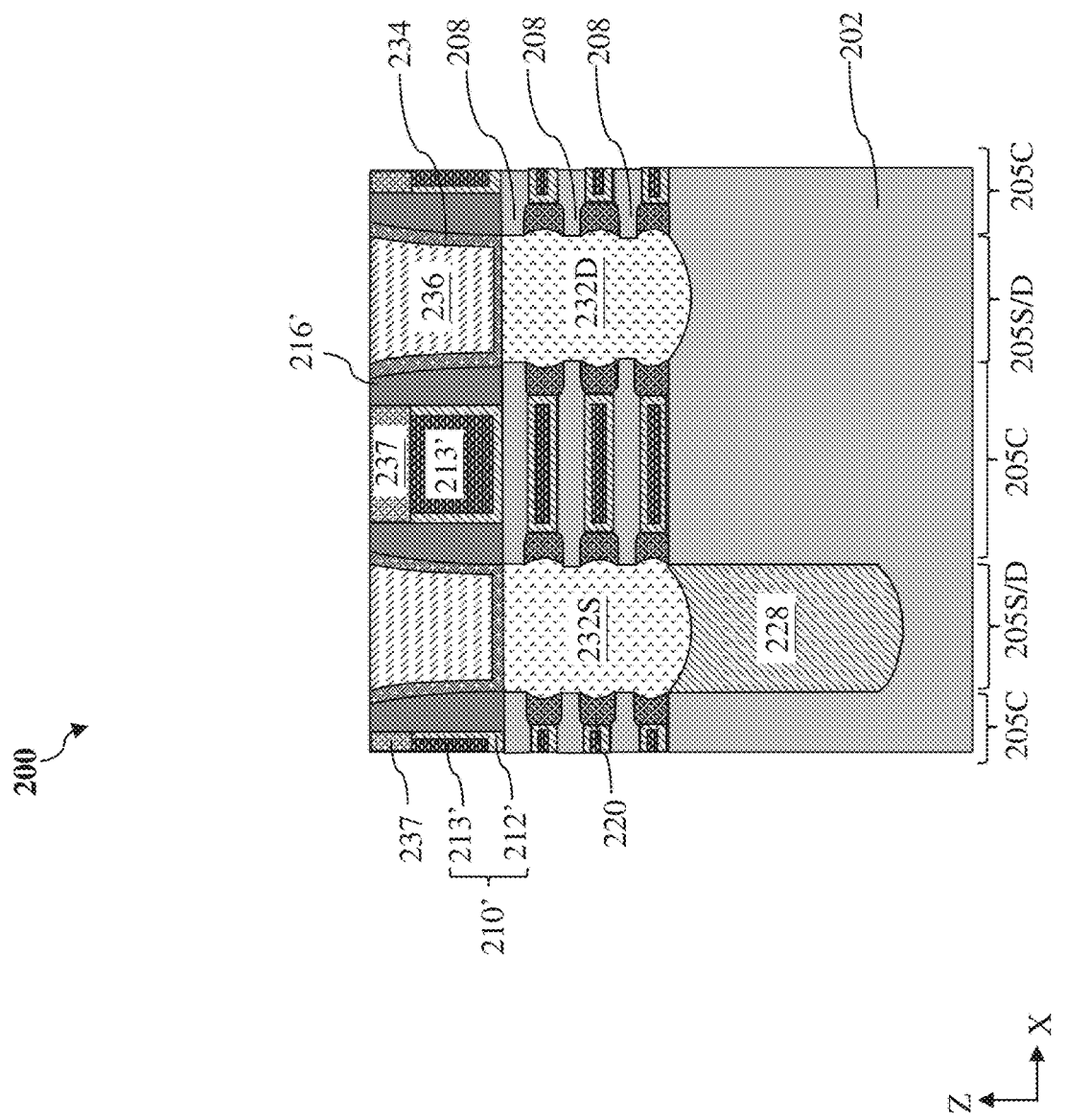

Referring to FIGS. 1 and 10, method 100 includes a block 114 where the dummy gate stacks 210 are replaced with the gate structures 210'. With the exposure of the dummy gate electrode layer 213, block 114 proceeds to removal of the dummy gate stacks 210. The removal of the dummy gate stacks 210 may include one or more etching process that are selective to the material in the dummy gate stacks 210. After the removal of the dummy gate stacks 210, the sacrificial layers 206 are selectively removed to release the channel layers 208 as channel members 208 in the channel regions 205C. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture).

The gate structures 210' are deposited to wrap over the channel members 208. Each of the gate structures 210' includes a gate dielectric layer 212' and a gate electrode layer 213' over the gate dielectric layer 212'. In some embodiments, the gate dielectric layer 212' includes an interfacial layer disposed on the channel members 208 and a high-k dielectric layer over the interfacial layer using ALD, CVD, and/or other suitable methods. Here, a high-k dielectric layer refers to a dielectric material having a dielectric constant greater than that of silicon dioxide, which is about 3.9. In some embodiments, the interfacial layer includes silicon oxide. The high-k dielectric layer may include hafnium oxide. Alternatively, the high-k dielectric layer may include other high-k dielectrics, such as titanium oxide, zirconium oxide, hafnium zirconium oxide, tantalum oxide, hafnium silicon oxide, zirconium silicon oxide, lanthanum oxide, aluminum oxide, yttrium oxide, SrTiO$_3$, BaTiO$_3$, BaZrO, hafnium lanthanum oxide, lanthanum silicon oxide, aluminum silicon oxide, hafnium tantalum oxide, hafnium titanium oxide, (Ba,Sr)TiO$_3$ (BST), silicon nitride, silicon oxynitride, combinations thereof, or other suitable material.

The gate electrode layer 213' is then deposited over the gate dielectric layer 212' using ALD, PVD, CVD, e-beam evaporation, or other suitable methods. The gate electrode layer 213' may include a single layer or alternatively a multi-layer structure, such as various combinations of a metal layer with a selected work function to enhance the device performance, a liner layer, a wetting layer, an adhesion layer, a metal alloy or a metal silicide. By way of example, the gate electrode layer 213' may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers).

In some embodiments, the workpiece 200 also includes a self-aligned capping (SAC) layer 237 formed directly over the gate electrode layer 213'. In some embodiments, the SAC layer 237 may be formed directly over the gate electrode layer 213' and on the gate spacer 216'. The composition of the SAC layer 237 is different than that of the bottom ILD layer 236 such that the bottom ILD layer 236 may be selectively removed in a subsequent process. In an embodiment, the SAC layer 237 includes silicon nitride. In some other embodiments, the SAC layer 237 may be formed of silicon oxycarbide, silicon carbide, silicon carbonitride, silicon nitride, silicon, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon oxycarbonitride, silicon, zirconium nitride, silicon carbonitride or combinations thereof.

Figure 11:
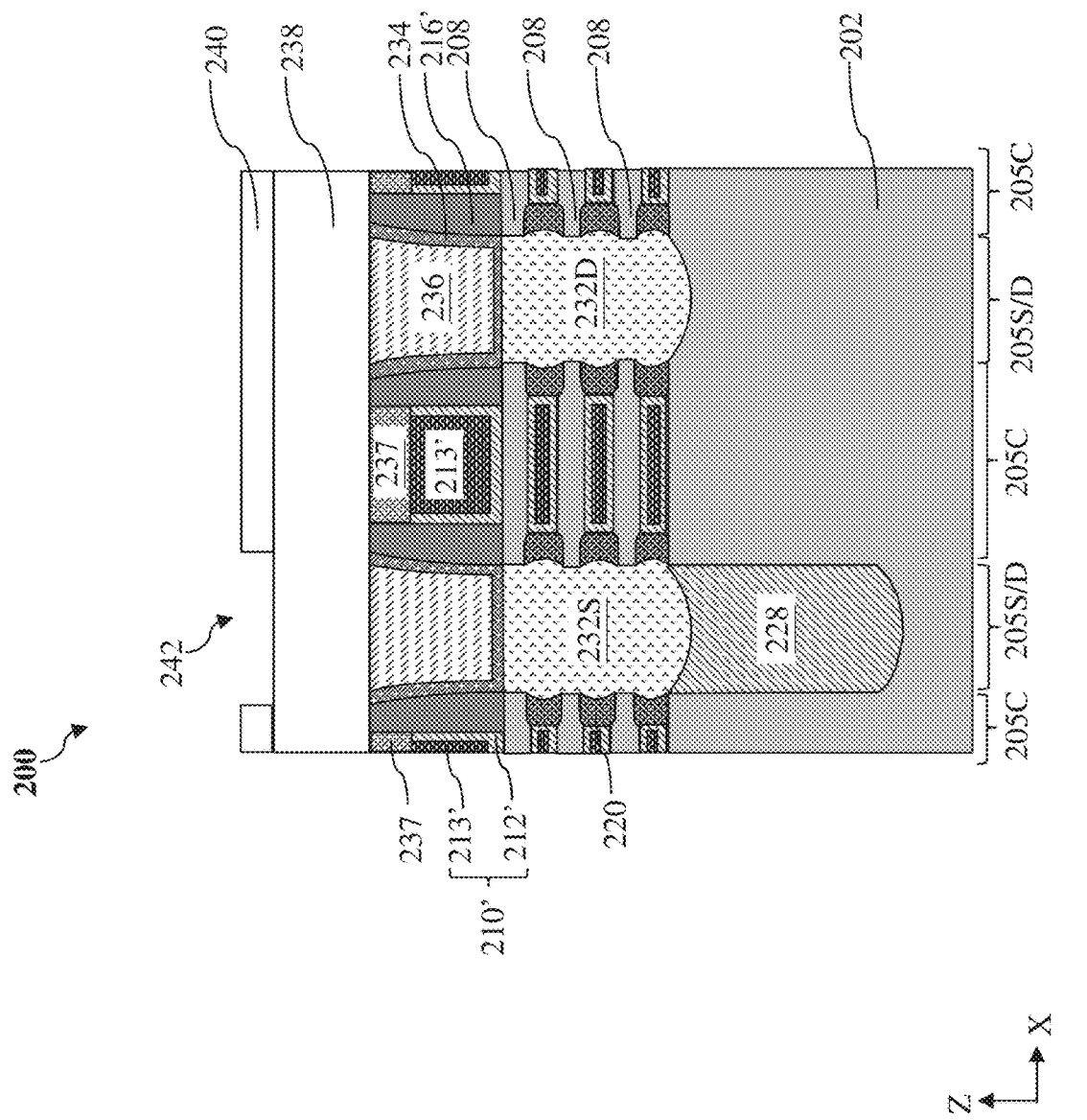
Figure 12:
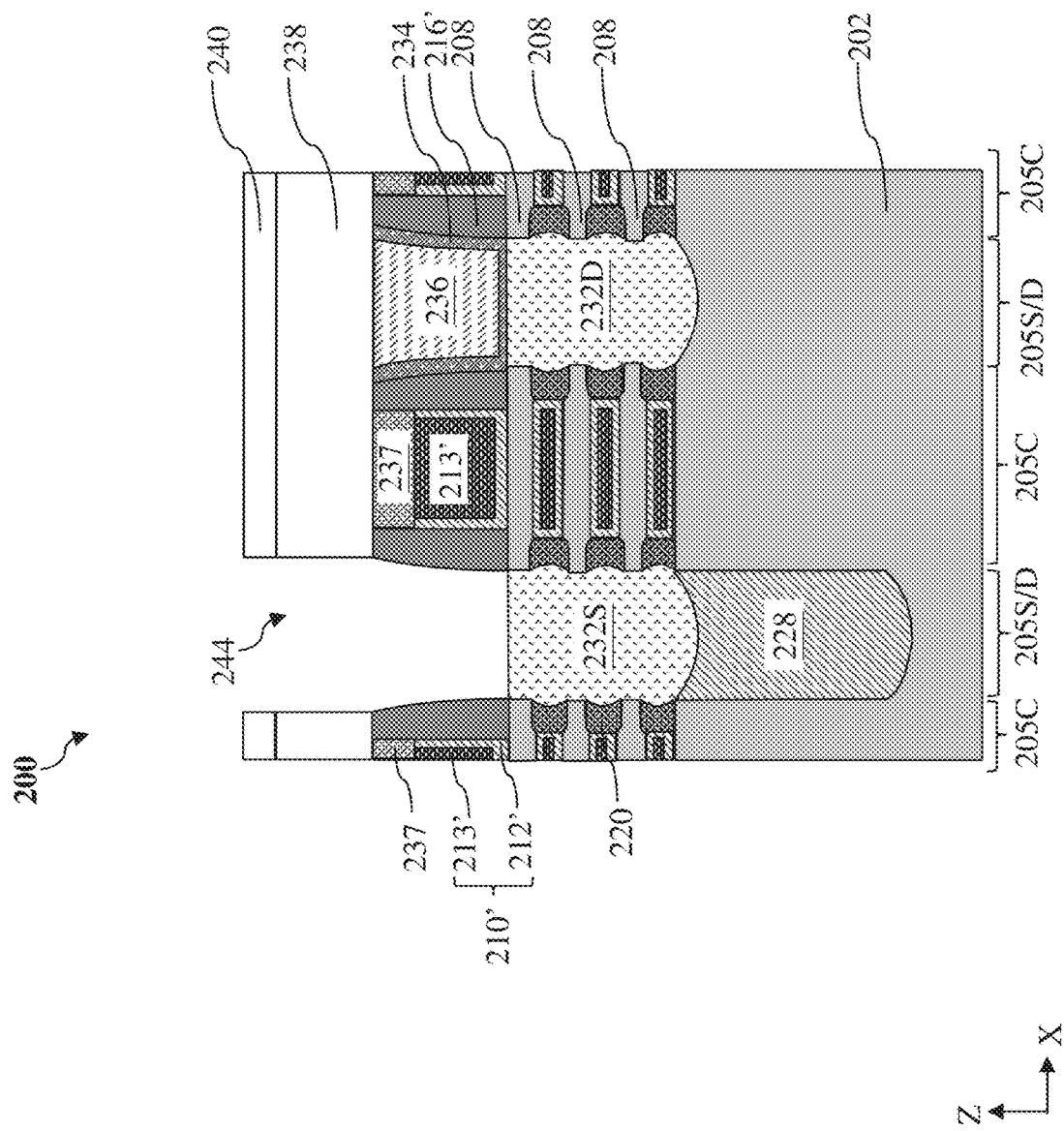

Referring to FIGS. 1 and 11-12, method 100 includes a block 116 where the CESL 234 and the bottom ILD layer 236 that are disposed directly over the source feature 232S are selectively removed to form a dielectric plug opening 244. As shown in FIG. 11, a first ILD layer 238 is deposited over the workpiece 200 by CVD, FCVD, PECVD, or other suitable process. In some embodiments, a composition of the first ILD layer 238 may be a way similar to that of the bottom ILD layer 236. A hard mask layer 240 may be deposited on the first ILD layer 238 and then patterned, by a lithography process, to form an opening 242. An exemplary lithography process includes spin-on coating a photoresist layer, soft baking of the photoresist layer, mask aligning, exposing, post-exposure baking, developing the photoresist layer, rinsing, and drying (e.g., hard baking). As shown in FIG. 12, while using the patterned hard mask layer 240 as an etch mask, one or more etching processes may be performed to the workpiece 200 to selectively remove the first ILD layer 238, the bottom ILD layer 236, and the CESL 234 exposed in the opening 242 to form a dielectric plug opening 244 exposing the source feature 232S. In some embodiments, the one or more etching processes may selectively remove the first ILD layer 238 and the bottom ILD layer 236 to form dielectric plug opening 244 over the CESL 234. That is, the source/drain features 232S are still protected by the CESL 234. The entire top surface of the source feature 232S is exposed in the dielectric plug opening 244. The etching processes may selectively etch the first ILD layer 238 and the bottom ILD layer 236 without substantially etching the gate spacer 216' and the SAC layer 237. The patterned hard mask layer 240 may be removed after forming the dielectric plug opening 244. In some embodiments, the dielectric plug opening 244 may also expose the top surface of the gate spacer 216'. In some embodiments, the dielectric plug opening 244 may also expose the top surface of SAC layer 237.

Figure 13:
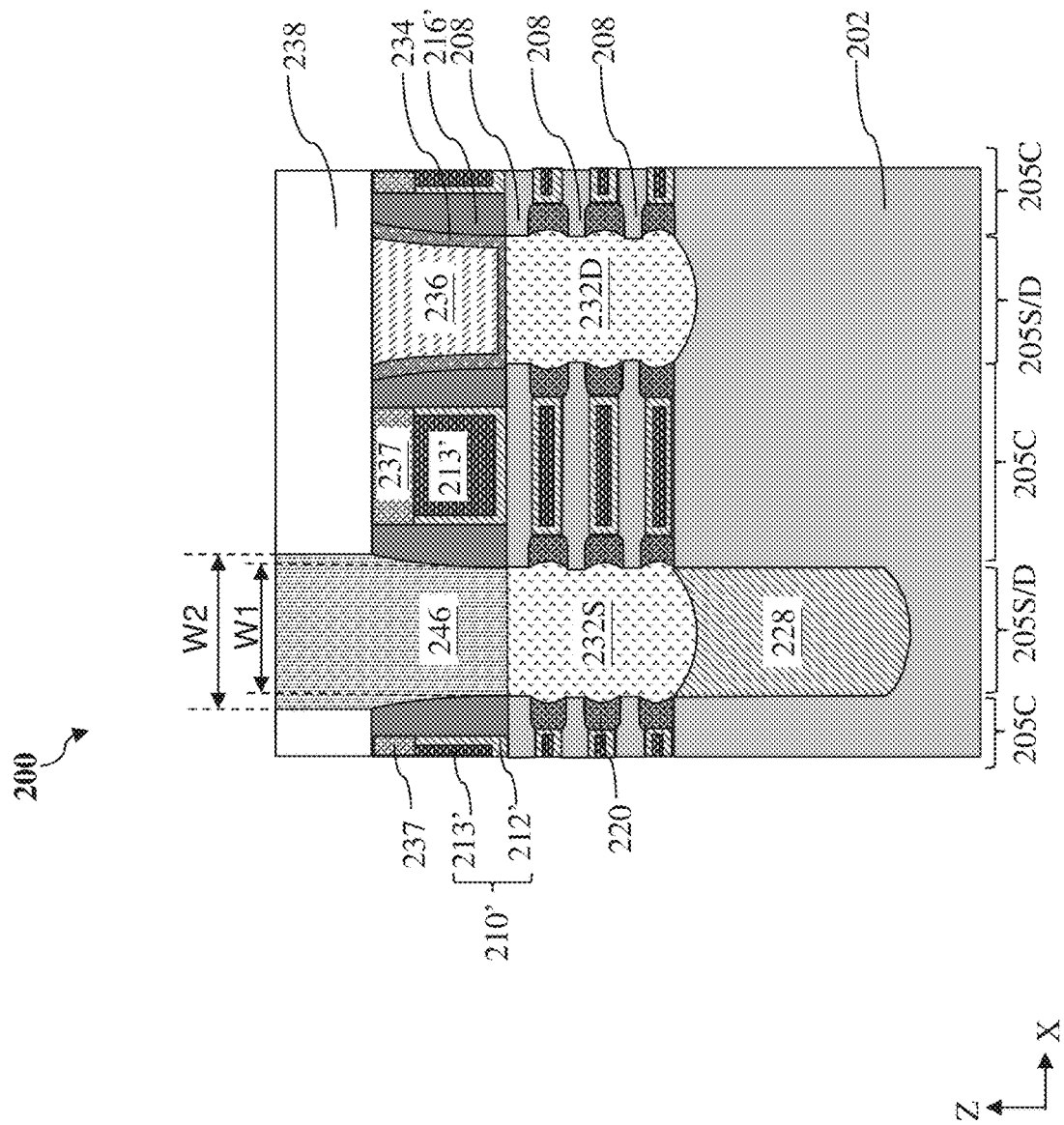
Figure 14:
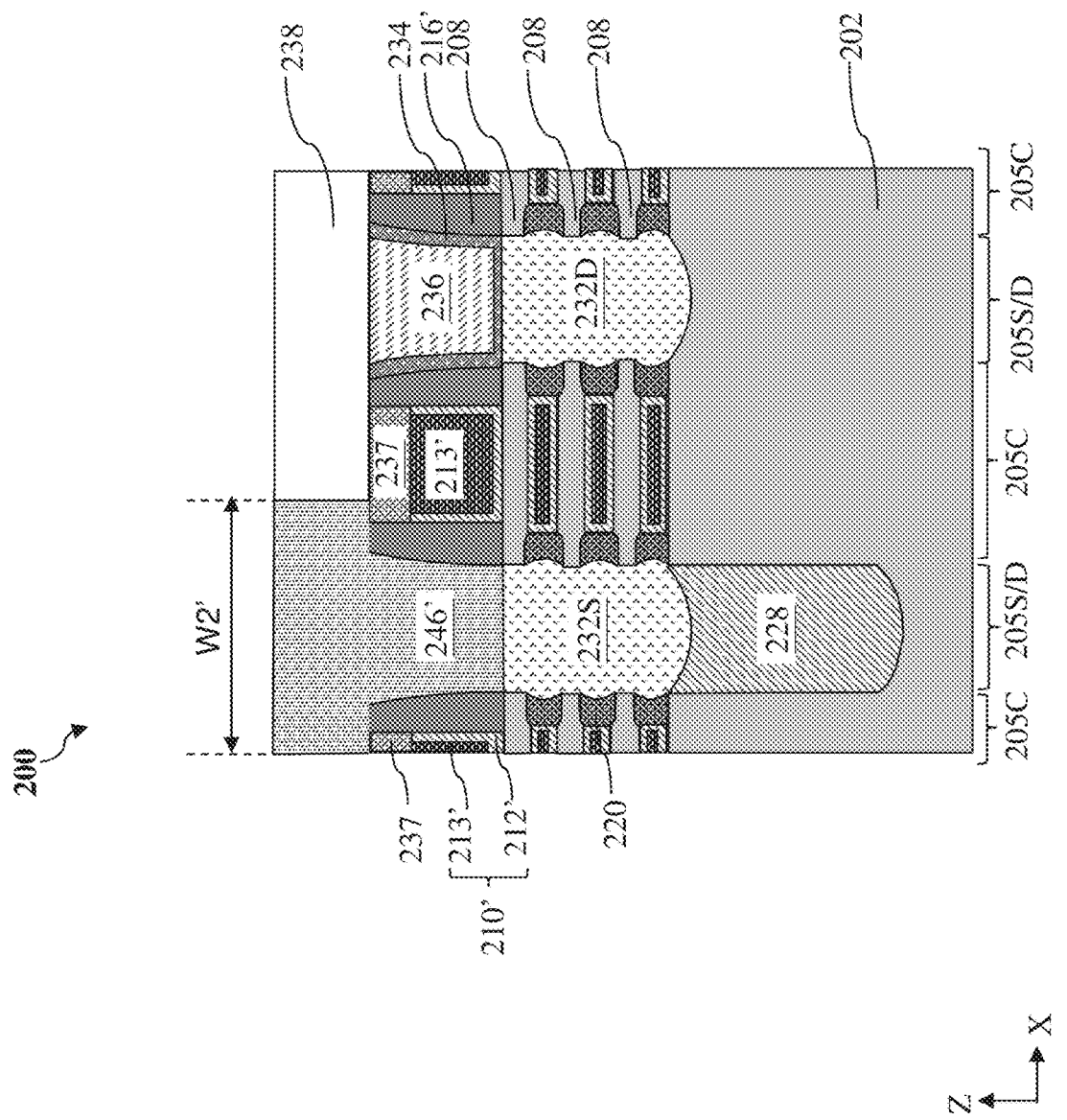

Referring to FIGS. 1 and 13, method 100 includes a block 118 where a dielectric plug 246 is formed in the dielectric plug opening 244. The formation of the dielectric plug 246 may include multiple processes such as deposition and planarization. For example, a dielectric plug layer may be deposited over the workpiece 200 and fill the dielectric plug opening 244 by ALD, PVD, CVD, or a suitable process. The dielectric plug layer may include silicon nitride, silicon carbide, silicon oxynitride, silicon carbonitride, silicon oxycarbide, silicon oxycarbonitride, or combinations thereof. A composition of the dielectric plug layer may be different than a composition of the SAC layer 237. The composition of the dielectric plug layer is also different than a composition of the first ILD layer 238 and the bottom ILD layer 236. In an embodiment, the gate spacer 216 may include silicon carbon oxynitride, the SAC layer 237 may include silicon nitride, the first ILD layer 238 may include silicon oxide, and the dielectric plug 246 may include silicon oxycarbide. A planarization process such as CMP is then performed to remove excessive dielectric plug over the first ILD layer 238 and provide a planar surface. The entire top surface of the source feature 232S is then directly covered by the dielectric plug 246. In implementations where the CESL layer 234 is not removed during the formation of the dielectric plug opening 244, the entire top surface of the source feature 232S would be covered by the CESL layer 234, and the entire top and sidewall surfaces of the CESL layer 234 would be covered by the dielectric plug 246. That is, a horizontal portion of the CESL layer 234 is sandwiched by the source/drain feature 232S and the dielectric plug 246. The dielectric plug 246 tracks the shape of the dielectric plug opening 244. The dielectric plug 246 includes a bottom surface in direct contact with the top surface of the source feature 232S. The bottom surface of the dielectric plug 246 has a width W1 (along the X direction) substantially equal to a width of the top surface of the source feature 232S. The dielectric plug 246 includes a top surface coplanar with a top surface of the first ILD layer 238 and has a width W2. In the depicted embodiment, W2 is greater than W1 and as a result, the dielectric plug 246 may have a funnel-like shape and tapered sidewalls. As described above, the dielectric plug opening 244 may also expose the top surface of SAC layer 237. FIG. 14 depicts an alternative embodiment where the corresponding dielectric plug 246' is formed directly on the gate spacer 216' and a portion of the SAC layer 237. That is, a width W2' of top surface of the dielectric plug 246' is greater than W2. It is understood that a shape of the dielectric plug 246 is not limited to the examples shown in FIGS. 13-14. By forming the dielectric plug 246 over the source feature 232S rather than forming a frontside source contact, a leakage current path between the frontside source contact and the to-be-formed gate contact via may be substantially eliminated. Forming the dielectric plug 246 on the source feature 232S would also increase the design flexibility of the gate contact via. The design flexibility of forming a gate contact via would be described in further detail with reference to FIGS. 28-37.

Figure 15:
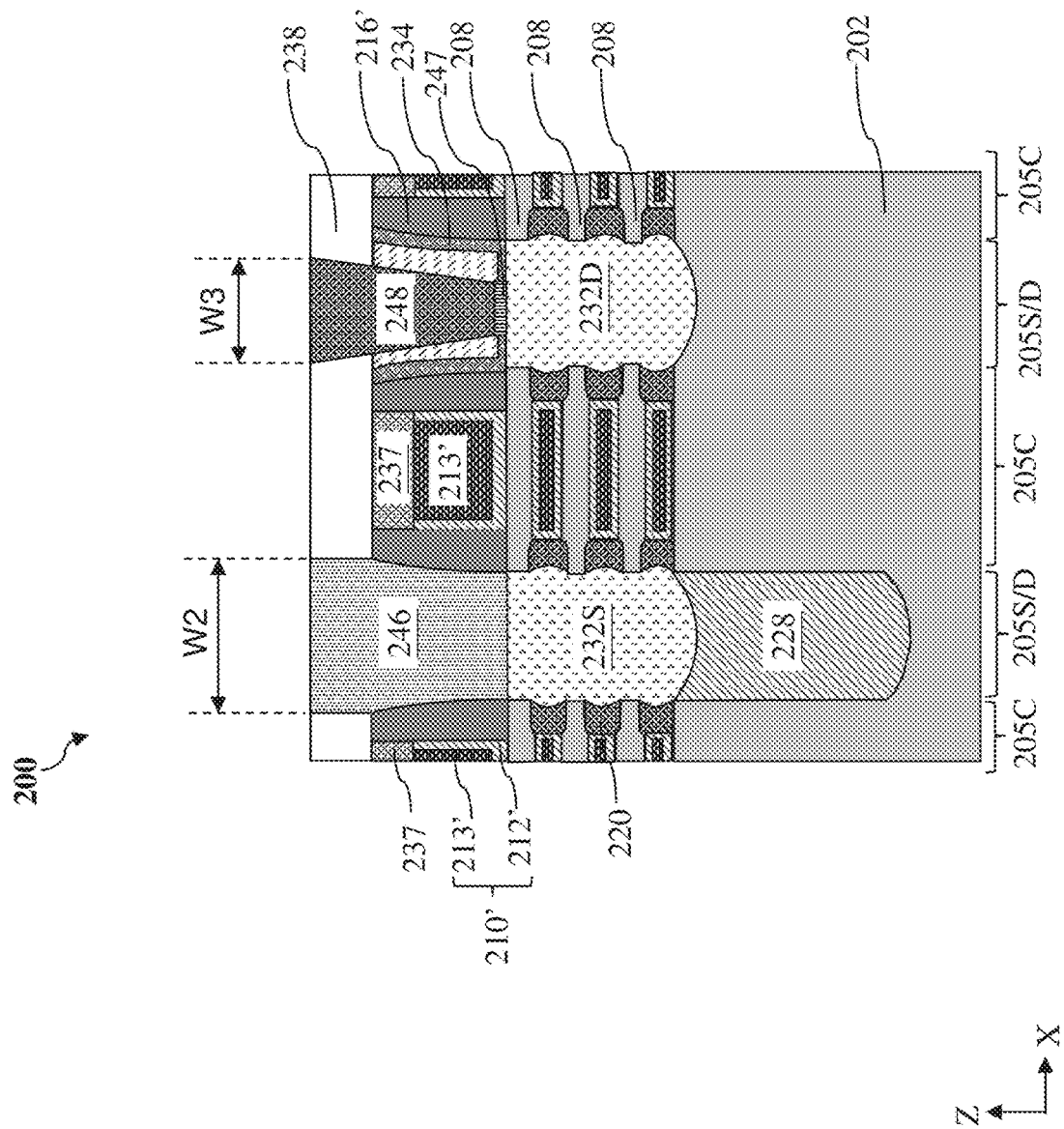

Referring to FIGS. 1 and 15, method 100 includes a block 120 where a drain contact 248 is formed over the drain feature 232D. The formation of the drain contact 248 may include forming a drain contact opening (filled by drain contact 248) penetrating through the first ILD layer 238, the bottom ILD layer 236, and the CESL 234 to expose at least a portion of the drain feature 232D. The formation of the drain contact opening may include photolithography and etching processes. A silicide layer 247 is then formed in the drain contact opening. In some instances, the silicide layer 247 may include titanium silicide, cobalt silicide, nickel silicide, tantalum silicide, or tungsten silicide. A drain contact 248 is then formed over the silicide layer 247. The drain contact 248 may include a barrier layer (not explicitly shown) deposited over the top surface of the workpiece 200. The barrier layer may include a metal or a metal nitride, such as a titanium nitride, cobalt nitride, nickel, tungsten nitride. Thereafter, a metal fill layer (not explicitly shown) may be deposited over the barrier layer. The metal fill layer may include tungsten, ruthenium, cobalt, nickel, or copper. A CMP process may be followed to remove excessive materials, define the final shape of the drain contact 248 and the dielectric plug 246, and provide a planar surface. In some embodiments, the width W2 of the dielectric plug 246 is greater than the width W3 of a top surface of the drain contact 248. A height/width ratio of the dielectric plug 246 is smaller than a height/width ratio of the drain contact 248. In a hypothetical situation where the dielectric plug 246 is not formed to cover the source feature 232S, operations at block 120 would result in a frontside source contact disposed on the source feature 232S. While such a frontside source contact may be similar to the drain contact 248 in terms of composition, it may not serve any function because electrical signal to the source feature 232S is routed through the to-be-formed backside source contact. That is, such a frontside source contact would be a dummy source contact. Put differently, the formation of the dielectric plug 246 prevents the formation of the dummy source contact.

Figure 16:
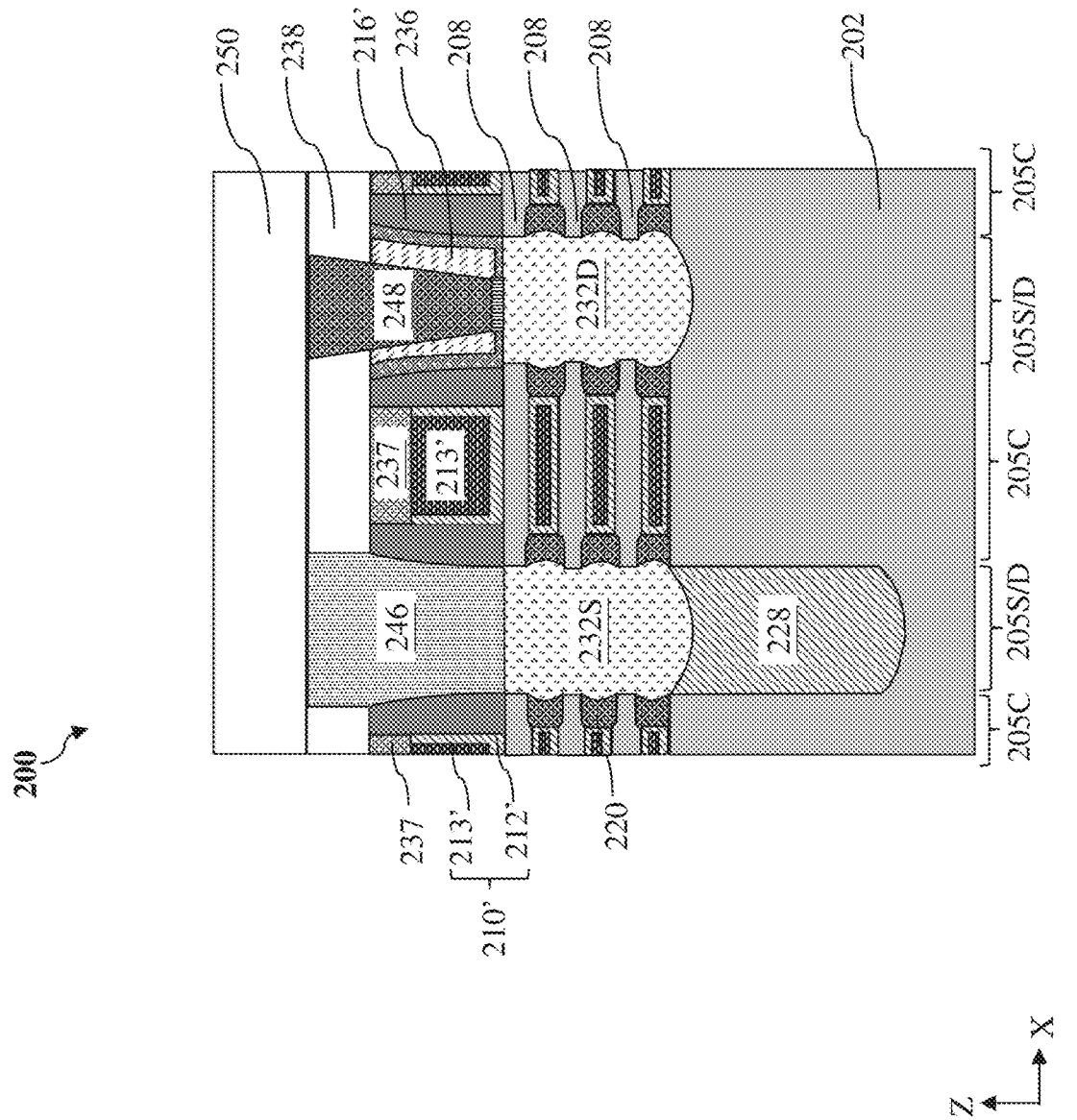
Figure 17:
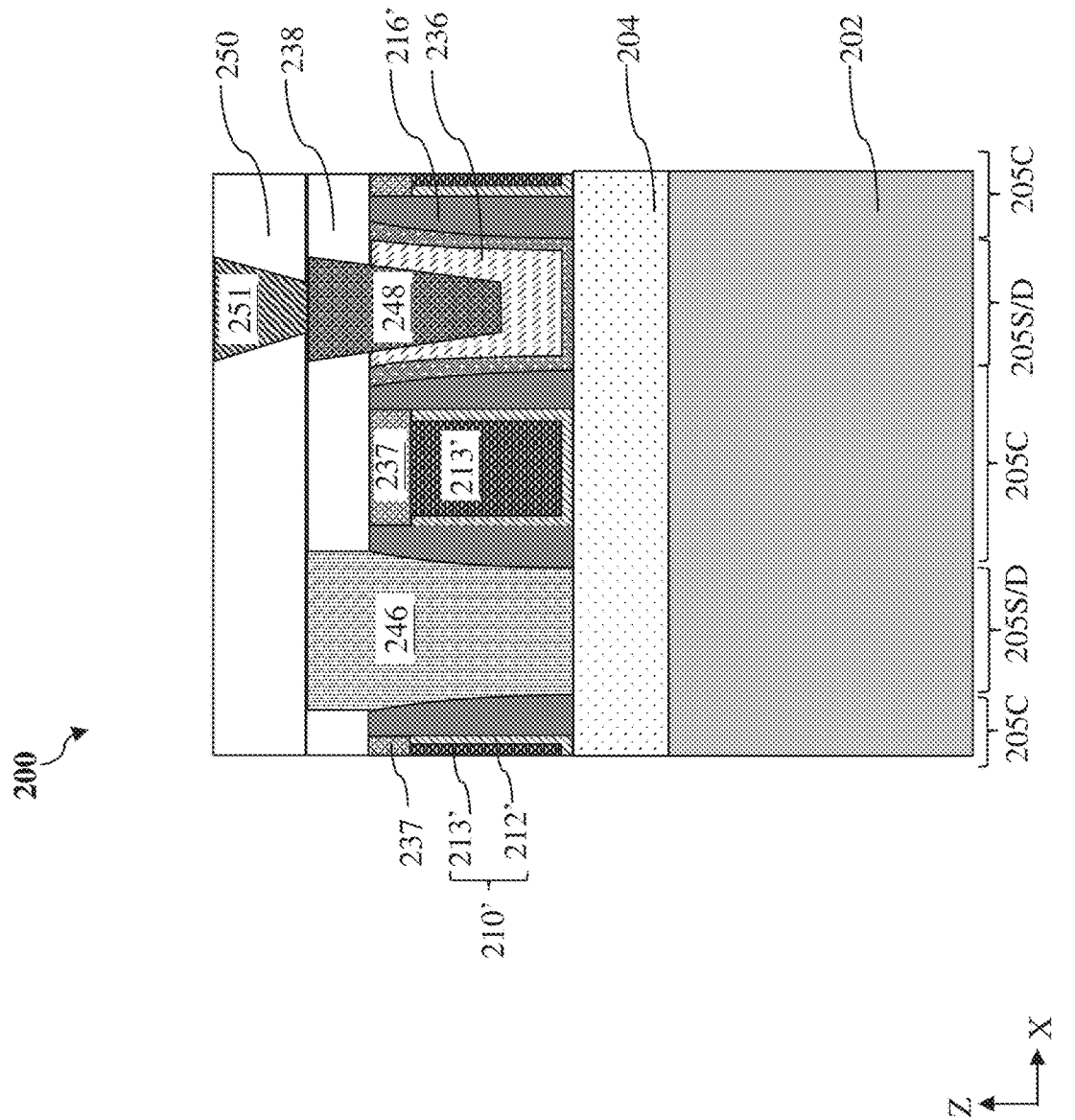
FIG. 17 illustrates a fragmentary cross-sectional view of an exemplary workpiece taken along line B-B' as shown in FIG. 2 during various fabrication stages in the method of FIG. 1, according to one or more aspects of the present disclosure.

Referring to FIGS. 1 and 16-17, method 100 includes a block 122 where a drain contact via 251 is formed over the drain contact 248. As illustrated in FIG. 16, a second ILD layer 250 is formed over the first ILD layer 238. The material and formation of the second ILD layer 250 may be in a way similar to those of the first ILD layer 238. FIG. 17 shows a cross-sectional view of the workpiece 200 taken along line B-B' as shown in FIG. 2. A drain contact via opening (filled by drain contact via 251) may be formed by penetrating the second ILD layer 250 to expose a portion of the top surface of the drain contact 248. As shown in FIG. 17, the drain contact via 251 is formed on the drain contact 248 and fills the drain contact via opening. The drain contact via 251 may include a barrier layer and a metal fill layer over the barrier layer. The materials and formation of the barrier layer and the metal fill layer in the drain contact via 251 may be in a way similar to those of the drain contact 248 described with reference to FIG. 15. A CMP process is followed to remove excessive materials and define the final shape of the drain contact via 251. In some embodiments, methods of the present disclosure, such as method 100, do not form any frontside source contact via. Because the electrical routing to the source feature 232 is now through a backside source contact, any frontside source contact vias, if formed, would be dummy source contact vias that do not serve any function. In some embodiments, to accommodate with some existing technologies and reduce cost, a dummy source contact via may be formed along with the drain contact via and disposed on the dielectric plug 246. The dummy source contact via may be formed in a way similar to that of the drain contact via 251.

Figure 18:
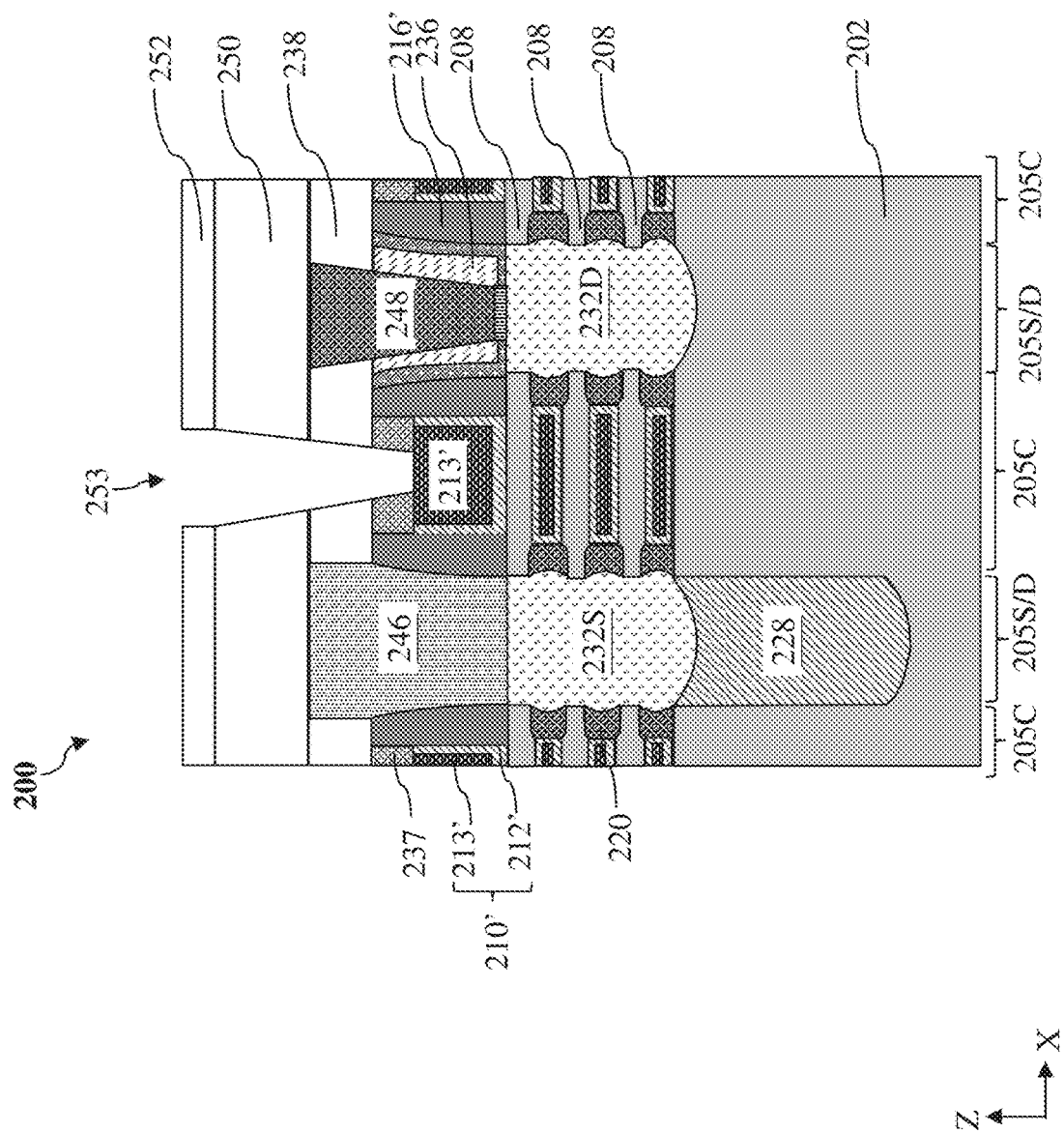
FIGS. 18-25 illustrate fragmentary cross-sectional views of an exemplary workpiece taken along line A-A' as shown in FIG. 2 during various fabrication stages in the method of FIG. 1, according to one or more aspects of the present disclosure.
Figure 19:
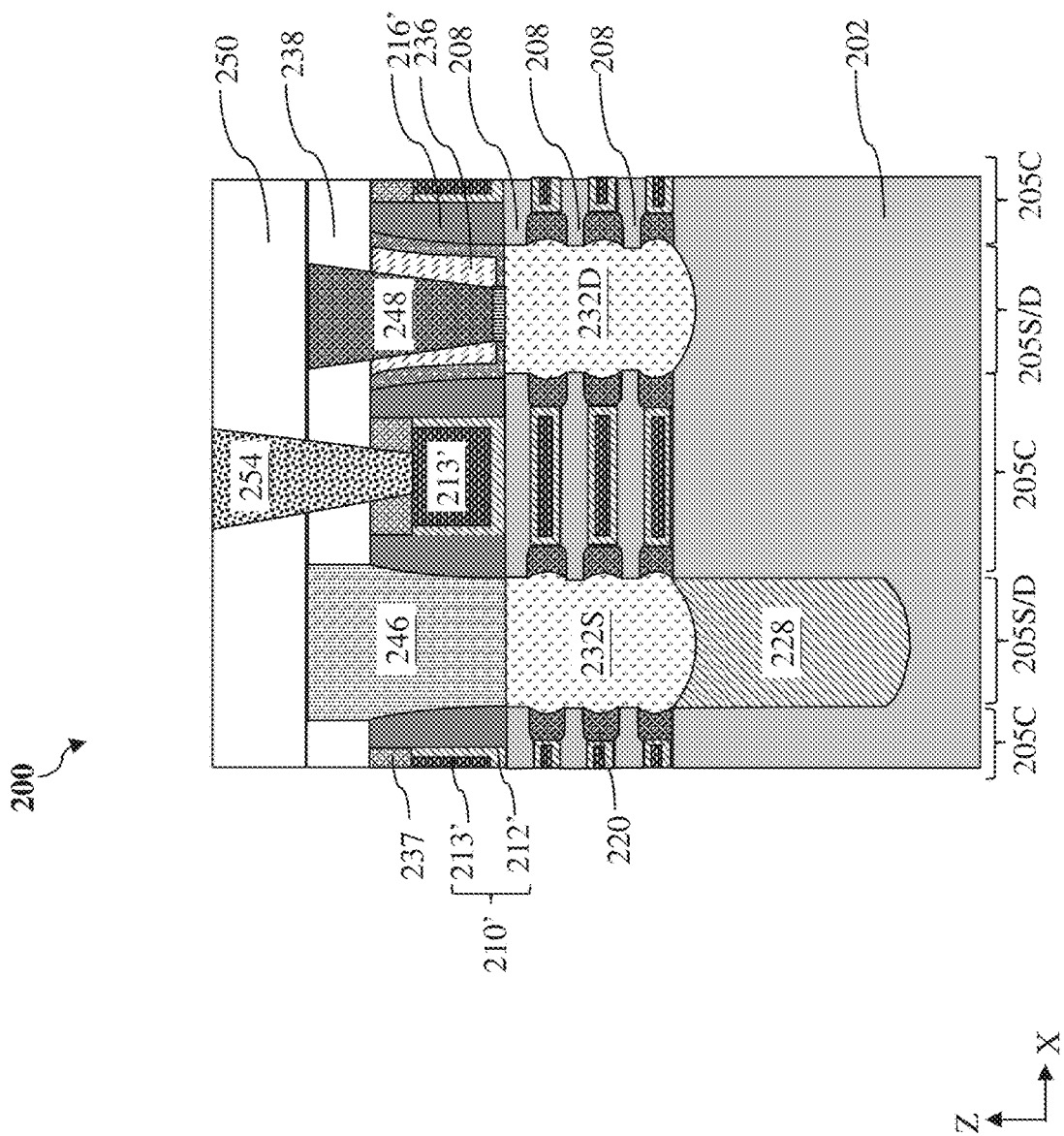

Referring to FIGS. 1 and 18-19, method 100 includes a block 124 where a gate contact via is formed over the gate structure 210'. As shown in FIG. 18, a patterned hard mask layer 252 is formed over the second ILD layer 250 to expose a portion of the second ILD layer 250. The patterned hard mask layer 252 may be obtained by coating a photoresist layer thereover and using a first photolithography mask to pattern the photoresist layer, and then using the patterned photoresist layer as an etch mask to pattern the hard mask layer. The patterned hard mask layer 252 is then used as an etch mask during an etching process to form a gate contact via opening 253 penetrating the second ILD layer 250, the first ILD layer 238, and the SAC layer 237. Referring to FIG. 19, a first gate contact via 254 is formed in gate contact via opening 253 and electrically connected to the gate electrode layer 213'. The processes and materials of forming the first gate contact via 254 may be in a way similar to those of the drain contact via 251. In this depicted example, an entire bottom surface of the first gate contact via 254 is in direct contact with the gate electrode layer 213'. In some embodiments, the first gate contact via 254 and the drain contact via 251 may be formed simultaneously. In some embodiments, the first gate contact via 254 may be formed before the formation of the drain contact via 251.

Figure 20:
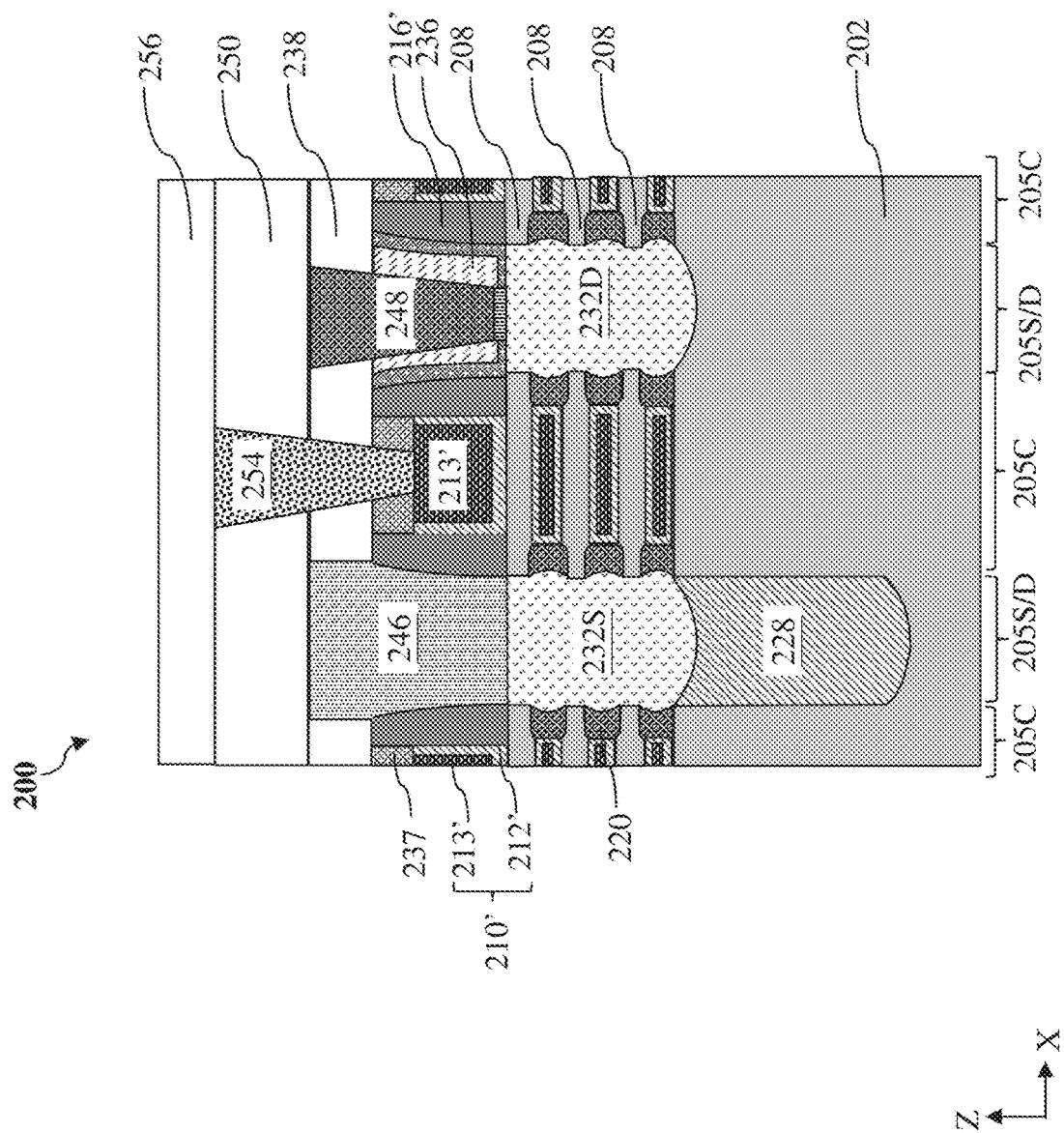

As shown in FIG. 20, after forming the first gate contact via 254 and the drain contact via 251, a first interconnect structure 256 is formed over the front side of the workpiece 200. In some embodiments, the first interconnect structure 256 may include multiple intermetal dielectric (IMD) layers and multiple metal lines or contact vias in each of the IMD layers. In some instances, the IMD layers and the bottom ILD layer 236 may share similar composition. The metal lines and contact vias in each IMD layer may be formed of metal, such as aluminum, tungsten, ruthenium, or copper. Because the first interconnect structure 256 is formed over the front side of the workpiece 200, the first interconnect structure 256 may also be referred to as a frontside interconnect structure 256.

Figure 21:
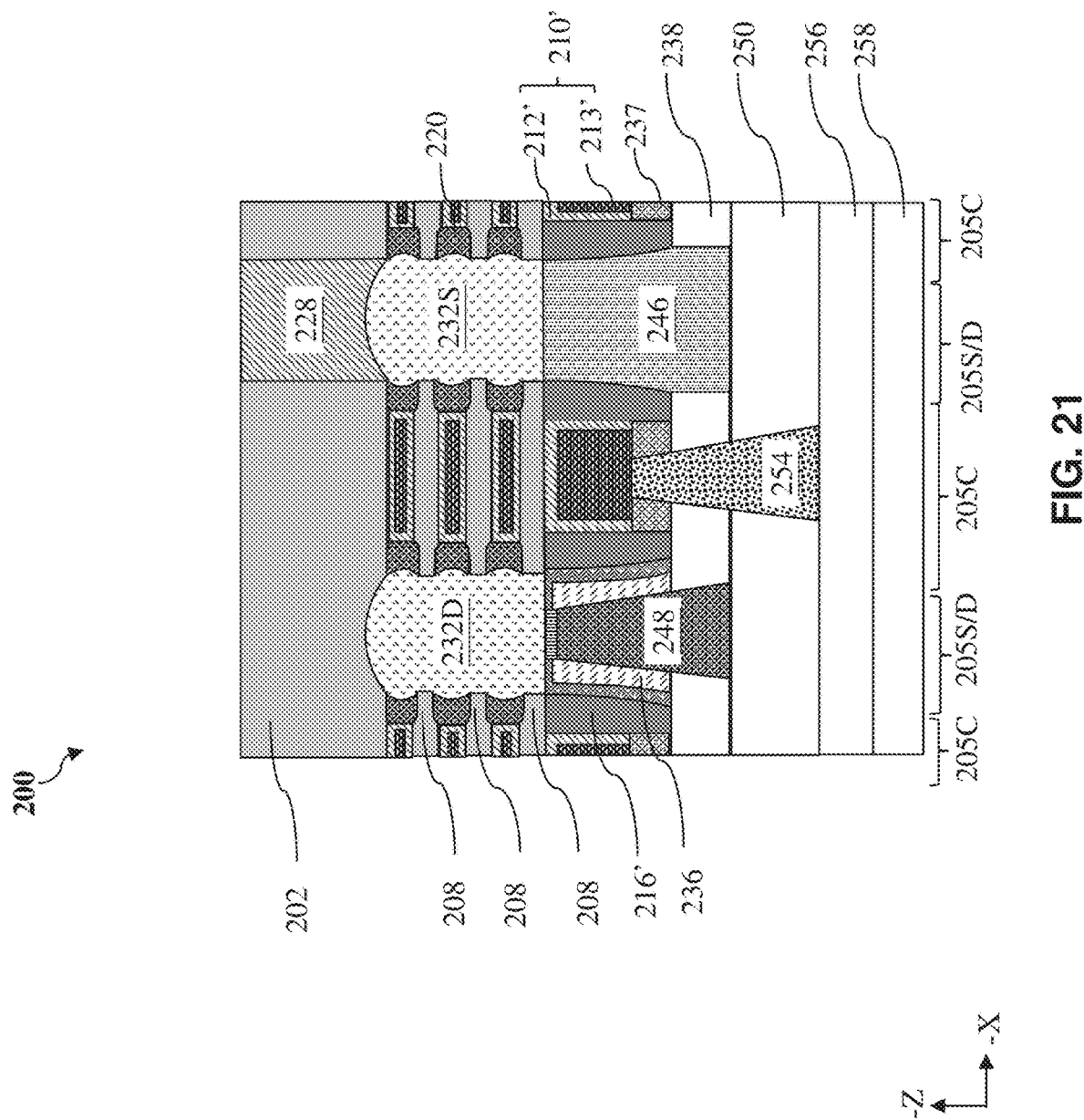

Referring to FIGS. 1 and 21, method 100 includes a block 126 where the workpiece 200 is flipped over and planarized to expose the semiconductor plug 228. A carrier substrate 258 is bonded to the first interconnect structure 256. In some embodiments, the carrier substrate 258 may be bonded to the workpiece 200 by fusion bonding, by use of an adhesion layer, or a combination thereof. In some instances, the carrier substrate 258 may include semiconductor materials (such as silicon), sapphire, glass, polymeric materials, or other suitable materials. Once the carrier substrate 258 is bonded to the first interconnect structure 256 of the workpiece 200, the workpiece 200 is flipped over. The back side of the workpiece 200 is then planarized to expose the semiconductor plug 228.

Figure 22:
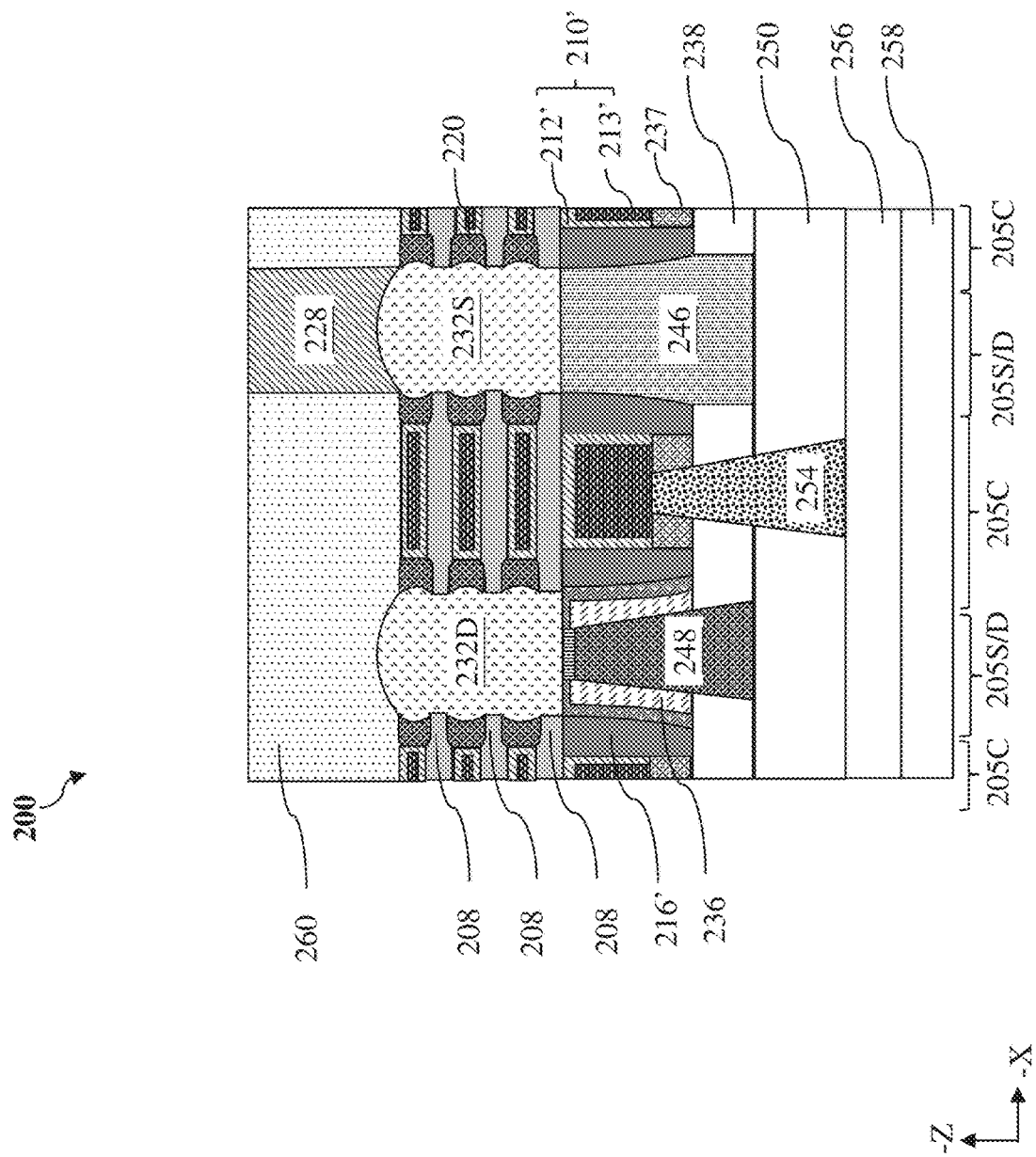

Referring to FIGS. 1 and 22, method 100 includes a block 128 where the substrate 202 is replaced by a backside dielectric layer 260. After exposing the semiconductor plug 228, the substrate 202 may be selectively removed to form a dielectric opening by a selective etching process, such as a selective wet etching process or a selective dry etching process. The selective removal of the substrate 202 does not substantially damage the semiconductor plug 228. The dielectric layer 260 may be deposited over the back side of the workpiece 200 by a suitable process. In some instances, the dielectric layer 260 may have a composition similar to that of the bottom ILD layer 236. A planarization process, such as a CMP process, may be performed to planarize the back side of the workpiece 200, remove excessive dielectric layer 260 over the semiconductor plug 228.

Figure 23:
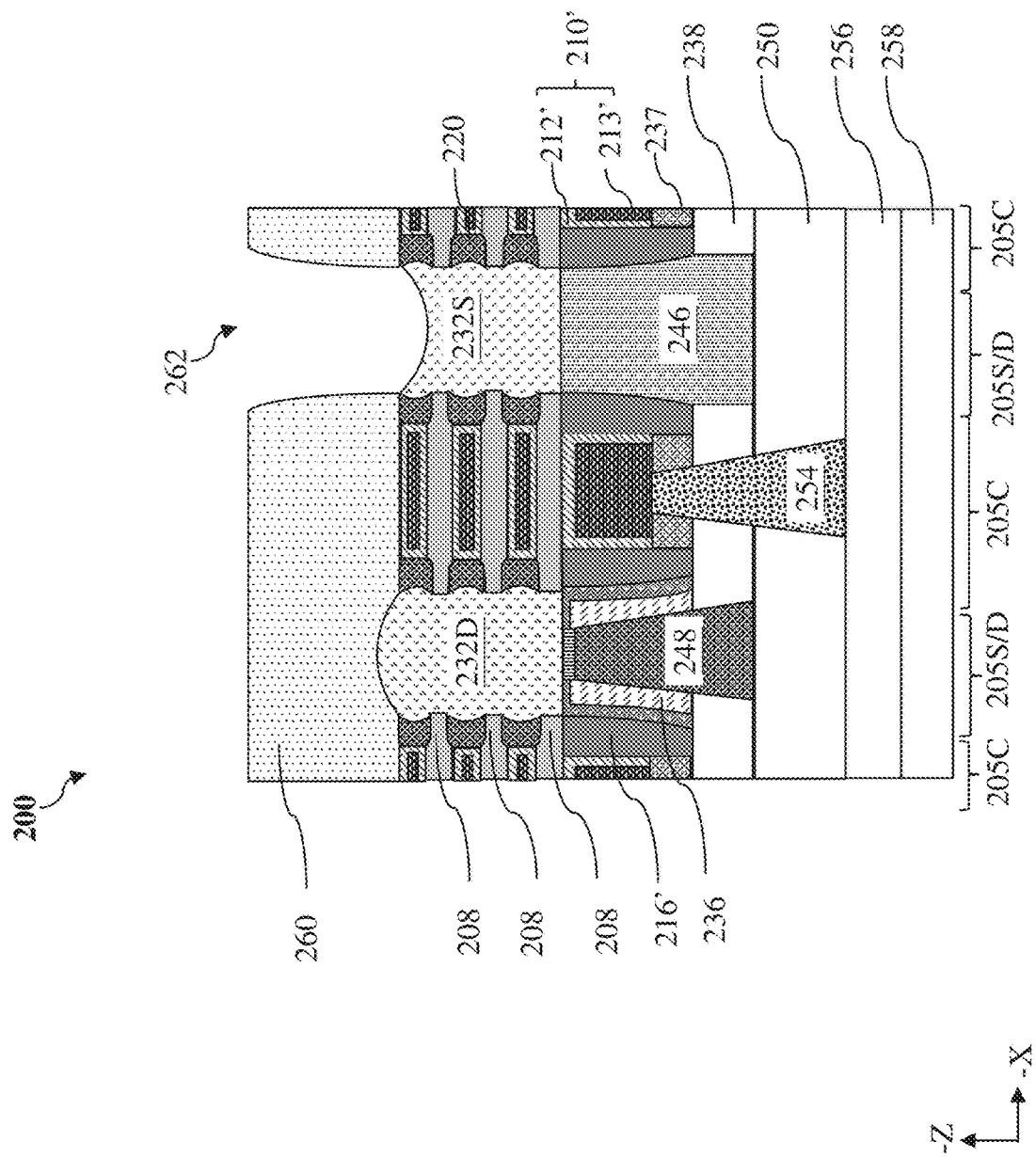
Figure 24:
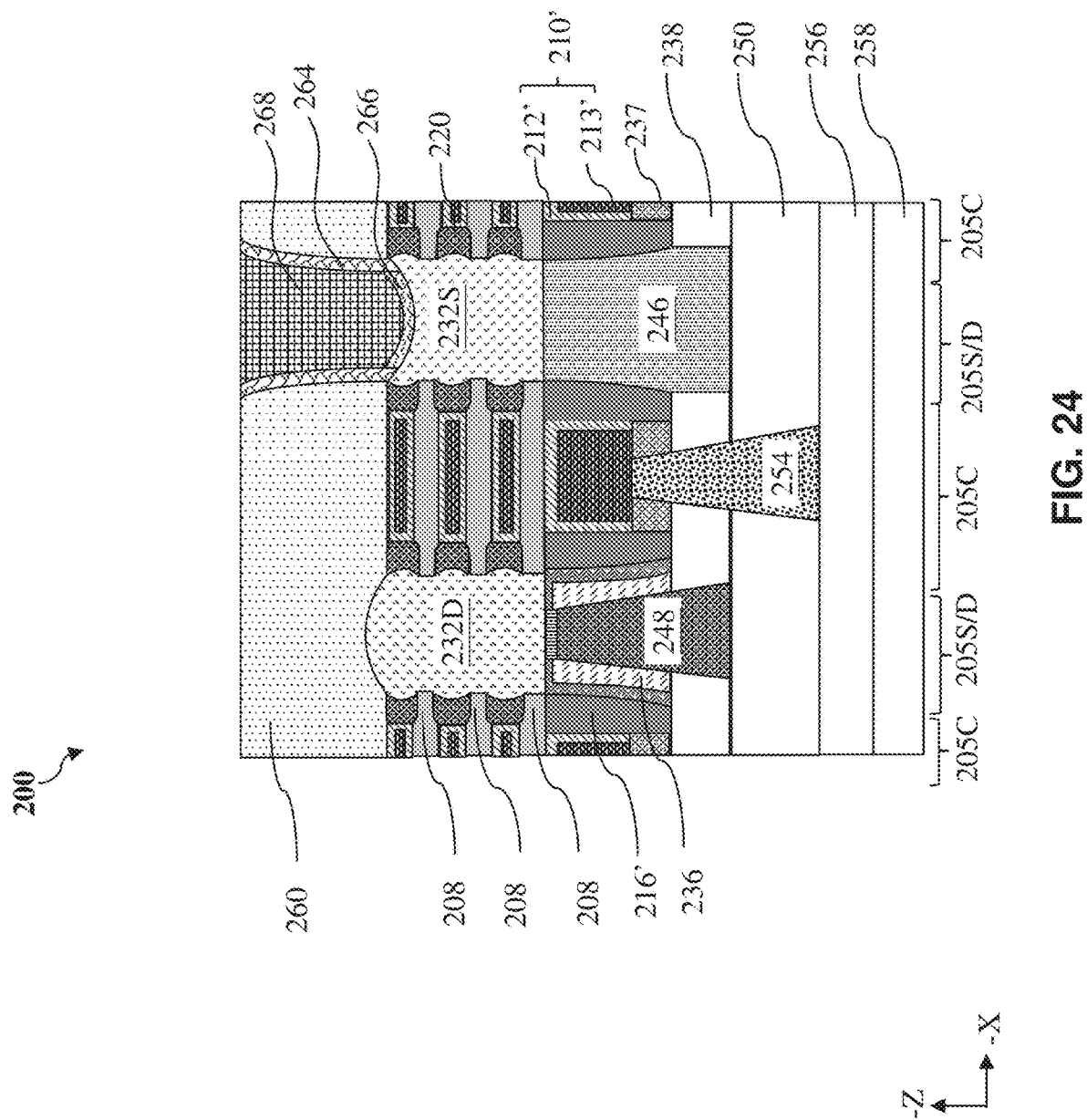

Referring to FIGS. 1 and 23-24, method 100 includes a block 130 where the semiconductor plug 228 is replaced with a backside source contact 268. Referring to FIG. 23, the semiconductor plug 228 is selectively removed without substantially damaging the dielectric layer 260 by performing a selective etching process. The etching process is stopped when the source feature 232S is exposed in a backside source contact opening 262 from the back side of the workpiece 200. The selective removal of the semiconductor plug 228 is self-aligned. In an embodiment, the selective etching process may use a mixture of ammonia hydroxide ($NH_4OH$), hydrogen peroxide ($H_2O_2$), and water ($H_2O$). As shown in FIG. 24, a dielectric barrier layer 264 is deposited over the workpiece 200 and is then etched back to only cover sidewalls of the backside source contact opening 262 and expose the source feature 232S. In some embodiments, the dielectric barrier layer 264 may include silicon nitride or other suitable materials. A silicide layer 266 is formed on the exposed surface of the source feature 232S to reduce a contact resistance between the source feature 232S and the to-be-formed backside source contact 268. The silicide layer 266 may include nickel silicide, nickel germanide, and nickel germanosilicide. After the formation of the silicide layer 266, the backside source contact 268 may be formed in the backside source contact opening 262. The backside source contact 268 may include aluminum, rhodium, ruthenium, copper, iridium, or tungsten. A planarization process, such as a CMP process, may follow to remove excessive materials and provide a planar surface. The backside source contact 268 is electrically coupled to the source feature 232S by way of the silicide layer 266. Since the formation of the backside source contact 268 is self-aligned, a width (along the X direction) of the backside source contact 268 is less than a width W2 of the dielectric plug 246.

Figure 25:
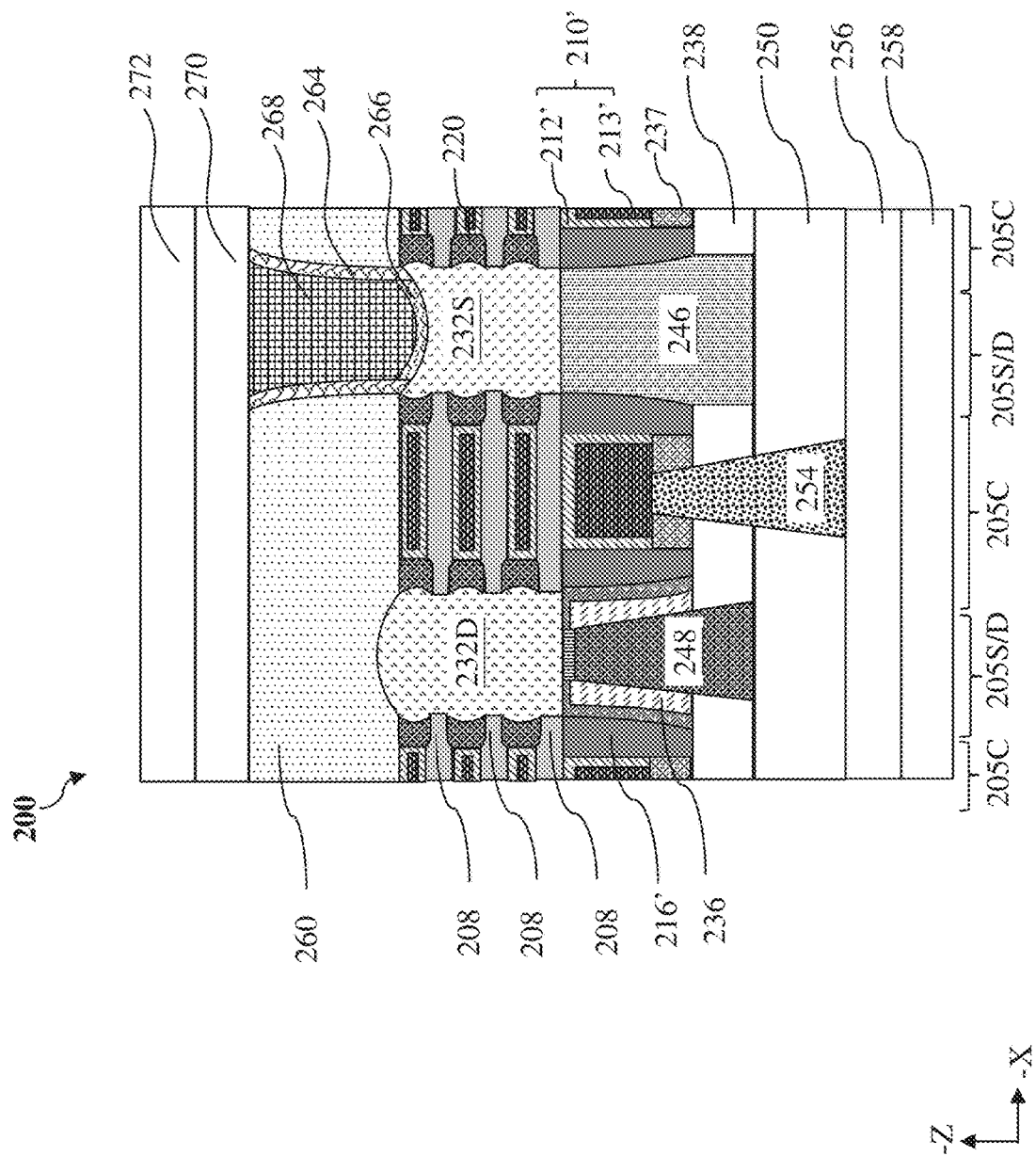

Referring to FIGS. 1 and 25, method 100 includes a block 134 where a backside power rail 270 is formed. While not explicitly shown in FIG. 25, the backside power rail 270 may be embedded in an insulation layer. In an exemplary process, an insulation layer having a composition similar to the bottom ILD layer 236 may be deposited over the backside of the workpiece 200, including over the dielectric layer 260 and the backside source contact 268. Then, a power rail trench may be patterned in the insulation layer. A backside power rail 270 may be then formed in the power rail trench. The composition and formation of the backside power rail 270 may be in a way similar to those of the drain contact 248 described with reference to FIG. 15. A CMP process may be performed to remove excessive materials. A second interconnect structure 272 is formed and has a structure in a way similar to the first interconnect structure 256. Because the second interconnect structure 272 is formed over the back side of the workpiece 200, the second interconnect structure 272 may also be referred to as a backside interconnect structure 272.

Figure 26:
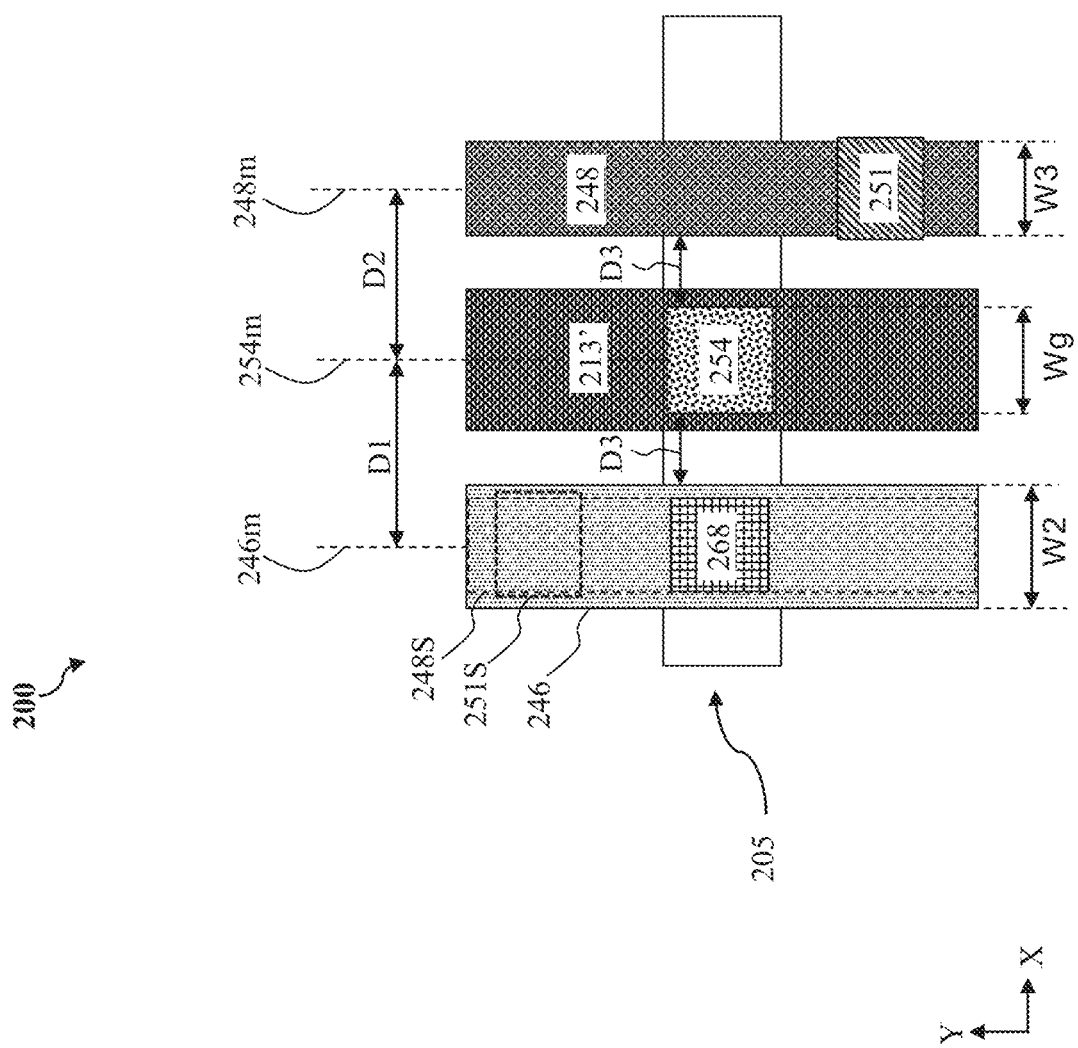
FIG. 26 illustrates a fragmentary top layout view of the exemplary workpiece shown in FIG. 25.
Figure 27:
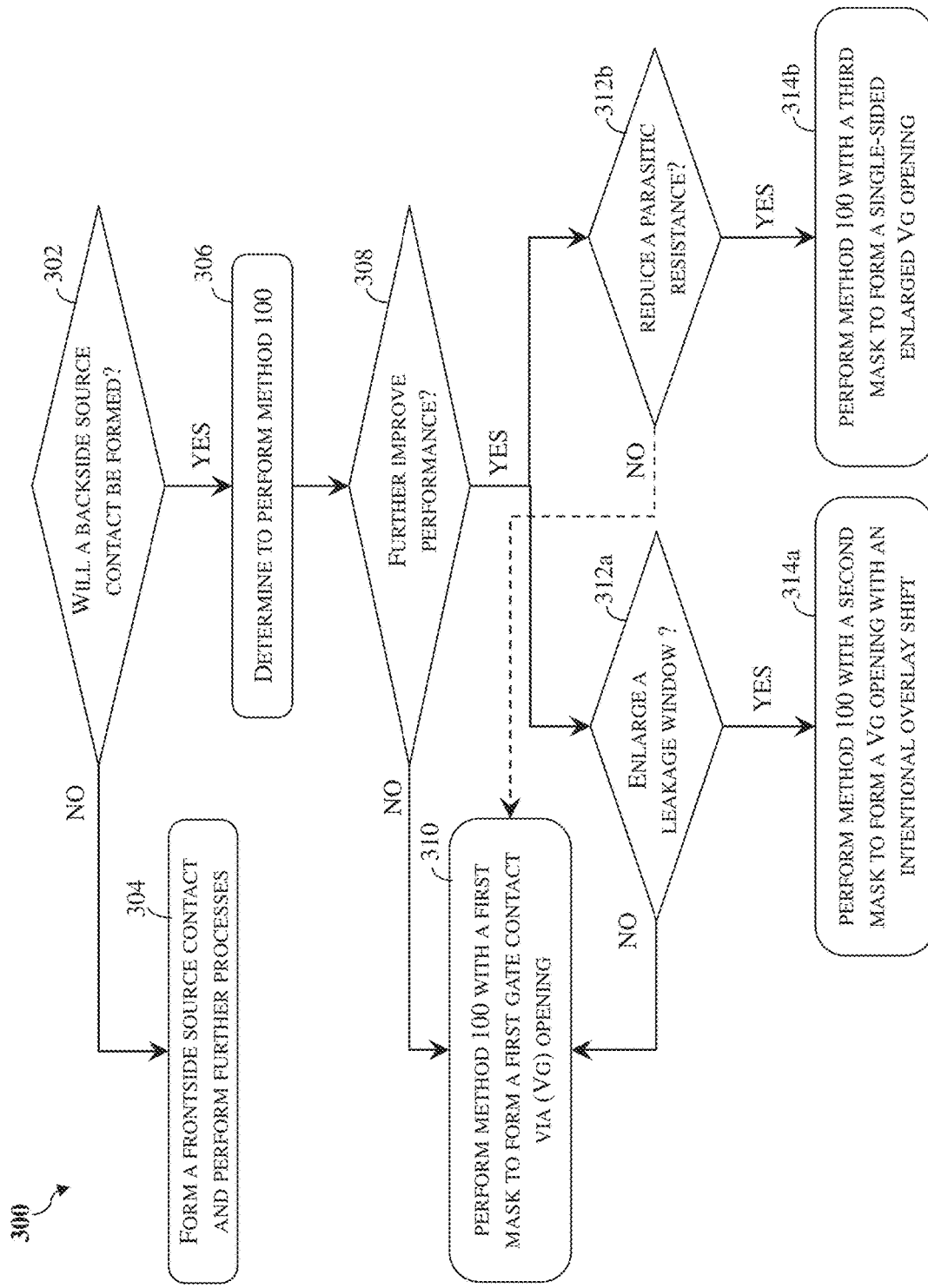
FIG. 27 illustrates a flow chart of an exemplary method for determining a configuration of a gate contact via to be formed in the method of FIG. 1, according to one or more aspects of the present disclosure.

FIG. 26 depicts an exemplary top layout view of the workpiece 200. Since the formation of the backside source contact 268 is self-aligned, the backside source contact 268 is formed under the fin-shaped structures 205. More specifically, the backside source contact 268 is formed under the source feature 232S (not explicitly shown). As described above, methods of the present disclosure do not form a frontside conductive source contact 248S. Instead, the dielectric plug 246 is formed over the source feature 232S. The dielectric plug 246 has a width W2 greater than that of the backside source contact 268. The first gate contact via 254 is formed over the gate electrode layer 213' and has a width Wg along the X direction. The drain contact via 251 is formed over the drain contact 248. In an embodiment, a center line 254m of the first gate contact via 254 aligns with a center line of the gate structure 210'. A distance D1 between the center line 254m and a center line 246m of the dielectric plug 246 is substantially equal to a distance D2 between the center line 254m and a center line 248m of the drain contact 248. A distance between the first gate contact via 254 and the drain contact 248 is shown as D3. Due to the formation of the dielectric plug 246, the design flexibility of gate contact via 254 increases because now the probability for the gate contact via 254 to be shorted to any frontside source contact or frontside source contact via thereon is null or negligible. That is, the tolerance of processing errors during the mask aligning in the lithography process and/or other inaccuracies for the formation of the gate contact via is increased. In addition, the absence of the frontside source contact via eliminates a parasitic capacitance between the frontside source contact via and the gate contact via 254. All of these can lead to a better device and yield performances, along with an increased reliability.

As described above, the IC technologies progress towards smaller technology nodes, and the close proximity among the frontside source/drain contacts (and/or frontside source/drain contact vias) and gate contact vias may increase parasitic capacitance among them and may lead to current leakage. In the above described method 100, the dielectric plug 246, rather than a frontside source contact, is formed directly on the source feature 232S. Therefore, a parasitic capacitance of the workpiece 200 may be advantageously reduced. Since the dielectric plug 246 is formed over the source feature 232S, the configuration (e.g., position, dimension) of the first gate contact via 254 may be adjusted to further improve the device performance. For example, a position of the first gate contact via 254 affects the distance between the first gate contact via 254 and the drain contact 248/drain contact via 251, and thus affects a corresponding parasitic capacitance and leakage. The dimension of the first gate contact via 254 determines a contact area between the first gate contact via 254 and the gate structure 210a', and thus affects a parasitic resistance. When a distance between the first gate contact via 254 and the drain contact 248/drain contact via 251 increases, a parasitic capacitance therebetween is reduced. However, the contact area may also reduce, leading to an increased parasitic resistance.

Semiconductor devices for different applications may have different requirements with regards to parasitic capacitance and parasitic resistance. For example, in applications such as high-speed wireless/wire-line communication, a smaller parasitic capacitance may be desired since parasitic capacitance would disadvantageously limit the high-frequency performance of radio frequency ICs (RFICs) in the wireless/wire-line communication system. In these applications, reducing the parasitic capacitance takes precedence over reducing the parasitic resistance. In applications such as electrostatic discharge (ESD) circuit or I/O circuit that peruse a better direct current (DC) characteristics, a smaller parasitic resistance may be desired to obtain a larger current, and reducing the parasitic resistance takes precedence over reducing the parasitic capacitance. By forming gate contact vias with different configurations (e.g., position, dimension) according to the present disclosure, the parasitic resistance and parasitic capacitance (and leakage current) associated with the gate contact via may be adjusted accordingly such that the semiconductor device may achieve improved performance.

FIG. 27 illustrates a flow chart of an exemplary method 300 of determining a configuration of a gate contact via to be formed during operations described at block 124 of method 100. The configuration of the gate contact via may include parameters that affect the parasitic resistance, parasitic capacitance and leakage of the workpiece 200. By selecting different photolithography masks to form gate contact via opening, the configuration of the gate contact via may be determined, thus the distance between the gate contact via and the drain contact, and the contact area between the gate contact via and the gate structure may be determined. By changing the configuration of the gate contact via, the parasitic resistance and the parasitic capacitance associated with the gate contact via may be varied according to the application of the resulting semiconductor device. Method 300 in FIG. 27 will be described in conjunction with FIGS. 28-37.

Referring to FIG. 27, method 300 includes a block 302 where whether to form a backside source contact in a workpiece 200 is determined. If no backside source contact will be formed in the workpiece 200, then the method 300 proceeds to block 304, where a workpiece 200 would be fabricated with a frontside source contact 248S and a frontside source via 251S (shown in FIG. 26) formed over the source feature 232S instead of forming the dielectric plug 246. The material and formation of the frontside source contact 248S may be in a way similar to those of the drain contact 248 described with reference to FIG. 15. In this situation, the gate contact via may have the same configuration as the first gate contact via 254 described above with reference to FIG. 18. Further processes (such as forming a frontside interconnect structure) may be performed. If the workpiece 200 is to be formed with a backside source contact (e.g., the backside source contact 268), then, the method 300 proceeds to block 306 where the above described method 100 that includes forming the dielectric plug 246 and the backside source contact 268 would be performed.

Still referring to FIG. 27, before fabricating a semiconductor device with method 100, at block 308, whether a final structure of the semiconductor device would be fabricated to have an improved performance comparing to that of the workpiece 200 in FIG. 25 is determined. Further improving the performance may introduce additional cost to existing fabrication processes. For example, new photolithography masks may be employed to facilitate the performance improvement. In situations where benefits outweigh costs, the to-be-fabricated semiconductor device may be determined to have an improved performance. If the to-be-fabricated semiconductor device would not have an improved performance or the cost of the improved performance outweighs its benefits, the method 300 then proceeds to block 310 and the semiconductor device would be fabricated in response to the method 100, and the first mask may be used to form the gate contact via opening 253 (and thus the first gate contact via 254 in the workpiece 200 in FIG. 25).

Still referring to FIG. 27, if the to-be-fabricated semiconductor device would have an improved performance, the method 300 then proceeds to both block 312a and block 312b. At block 312a, whether the to-be-fabricated semiconductor device would have an enlarged leakage window (and/or decreased parasitic capacitance) is determined. If the leakage window would not be enlarged, then the method 300 loops back to block 310. If the leakage window would be enlarged, then the method 300 proceeds to block 314a where a second photolithography mask would be used to facilitate the formation of a second gate contact via opening. The second photolithography mask would introduce an intentional overlay shift on the second gate contact via opening comparing to the first photolithography mask. A second gate contact via formed in the second gate contact via opening would have a second configuration. FIGS. 28-32 depict an alternative embodiment where the second photolithography mask is used during the fabrication of a workpiece 200A including a second gate contact via 254a with a second configuration.

Figure 28:
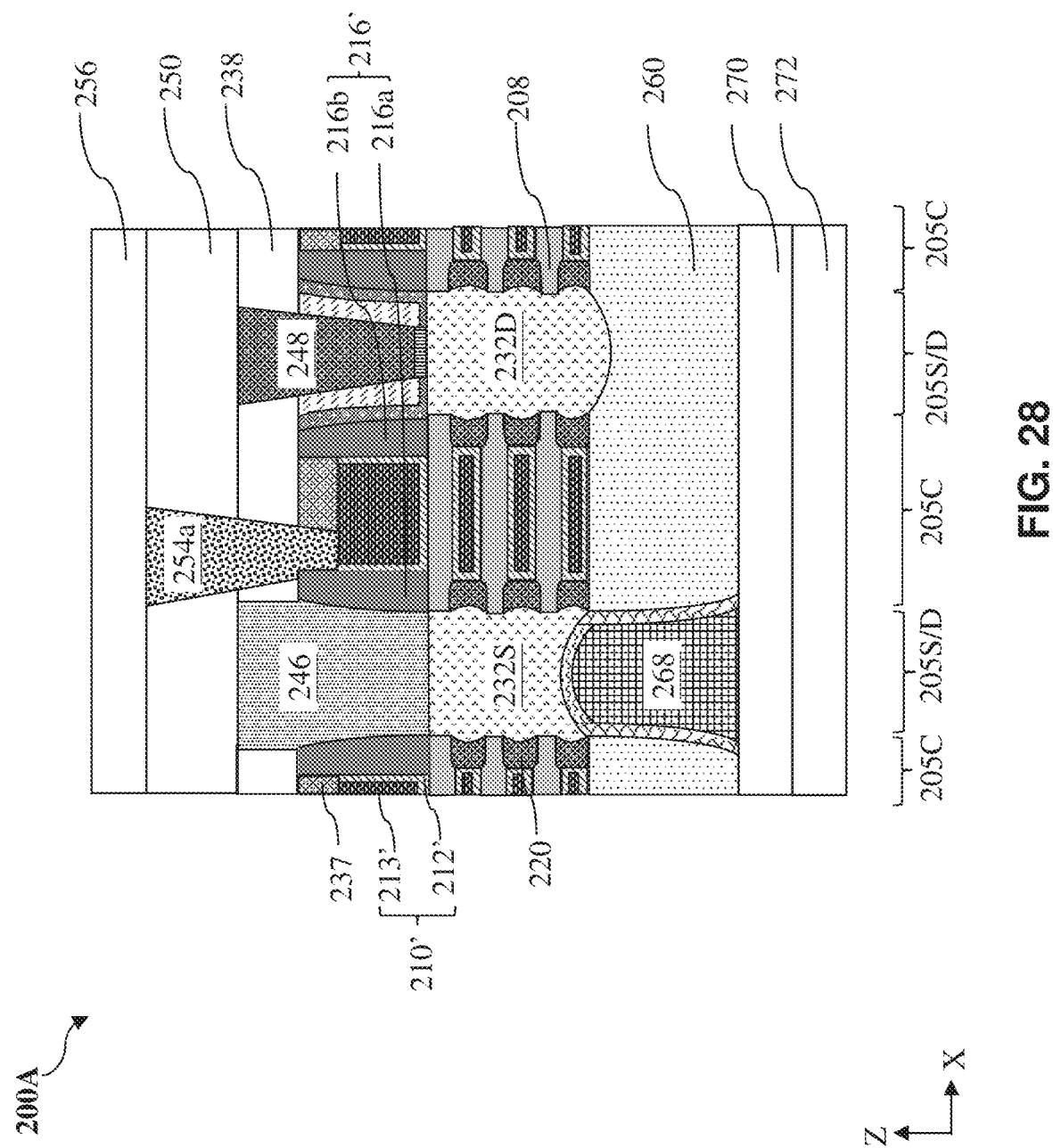
FIGS. 28-37 illustrate fragmentary cross-sectional views or top layout views of alternative embodiments of the exemplary workpiece during various fabrication stages in the method of FIG. 1, according to one or more aspects of the present disclosure.
Figure 29:
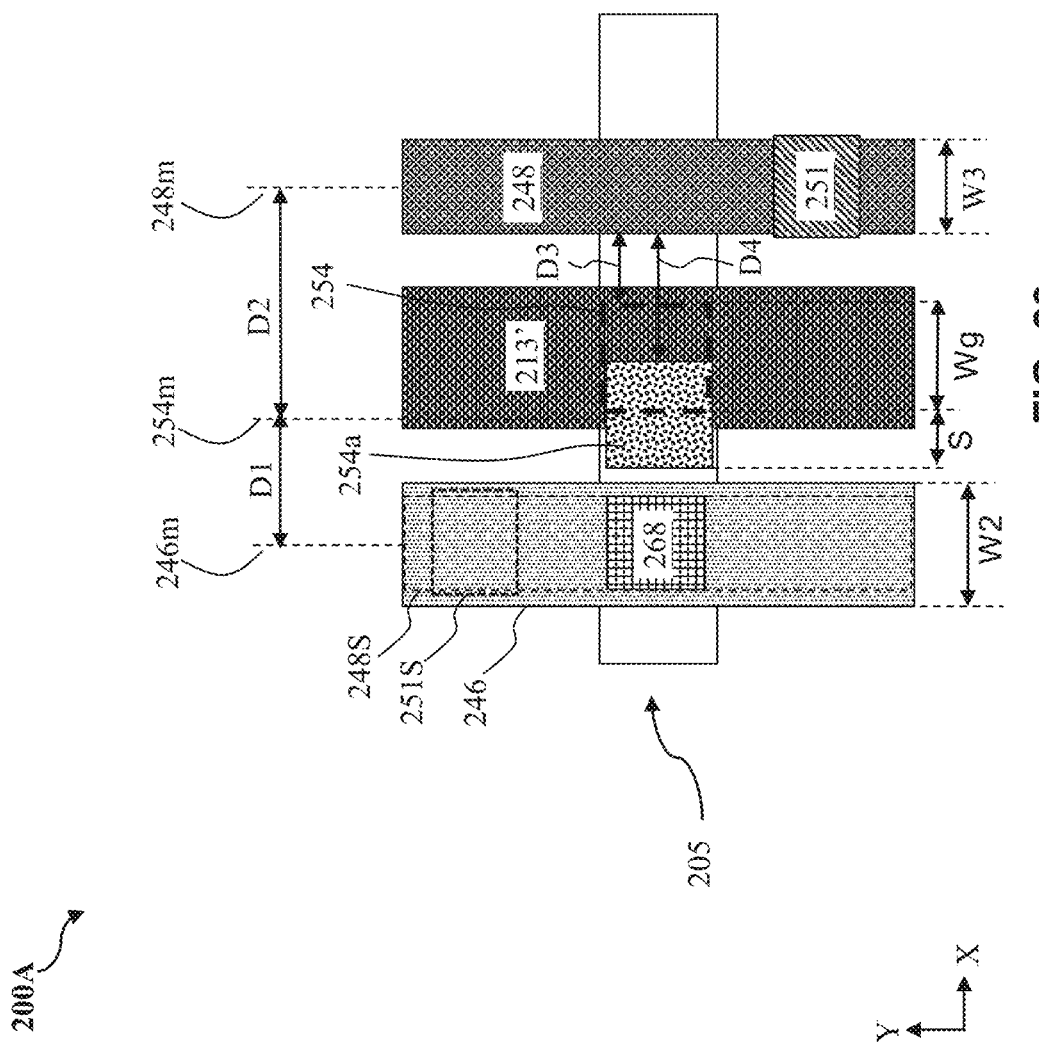

As shown in FIG. 28, the workpiece 200A includes a second gate contact via 254a, a gate spacer 216a adjacent to the dielectric plug 246, and a gate spacer 216b adjacent to the drain contact 248. The second gate contact via 254a is not only formed directly over the gate structure 210', but also disposed directly on the gate spacer 216a. In other words, the second gate contact via 254a is in direct contact with a portion of a top surface of the gate spacer 216a. A top surface of the gate spacer 216b is free of the second gate contact via 254a. Due to the intentional shift, there is an offset between a center line of the gate structure 210' and a center line 254m of the second gate contact via 254a. FIG. 29 shows an exemplary layout of the workpiece 200A. As shown in FIG. 29, the second contact via 254a is intentionally shifted towards the dielectric plug 246 with a distance S. The distance S may be less than 0.5*Wg such that the second gate contact via 254a is still on the gate structure 210' even if there is an unintentional misalignment during the second photolithography mask aligning and other inaccuracies in the lithography process for the formation of the second gate contact via opening. The unintentional misalignment may be less than 0.5*Wg. Wg is the width of the first gate contact via 254. Since the second gate contact via 254a is shifted, the distance D2 is greater than the distance D1. As shown in FIG. 29, a distance D4 between the drain contact 248 and the second gate contact via 254a is greater than the distance D3 between the drain contact 248 and the first gate contact via 254 (shown in dashed line). By increasing the distance from D3 to D4, the parasitic capacitance between the second gate contact via 254a and the drain contact 248 is advantageously reduced, and a leakage window is also advantageously enlarged.

Figure 30:
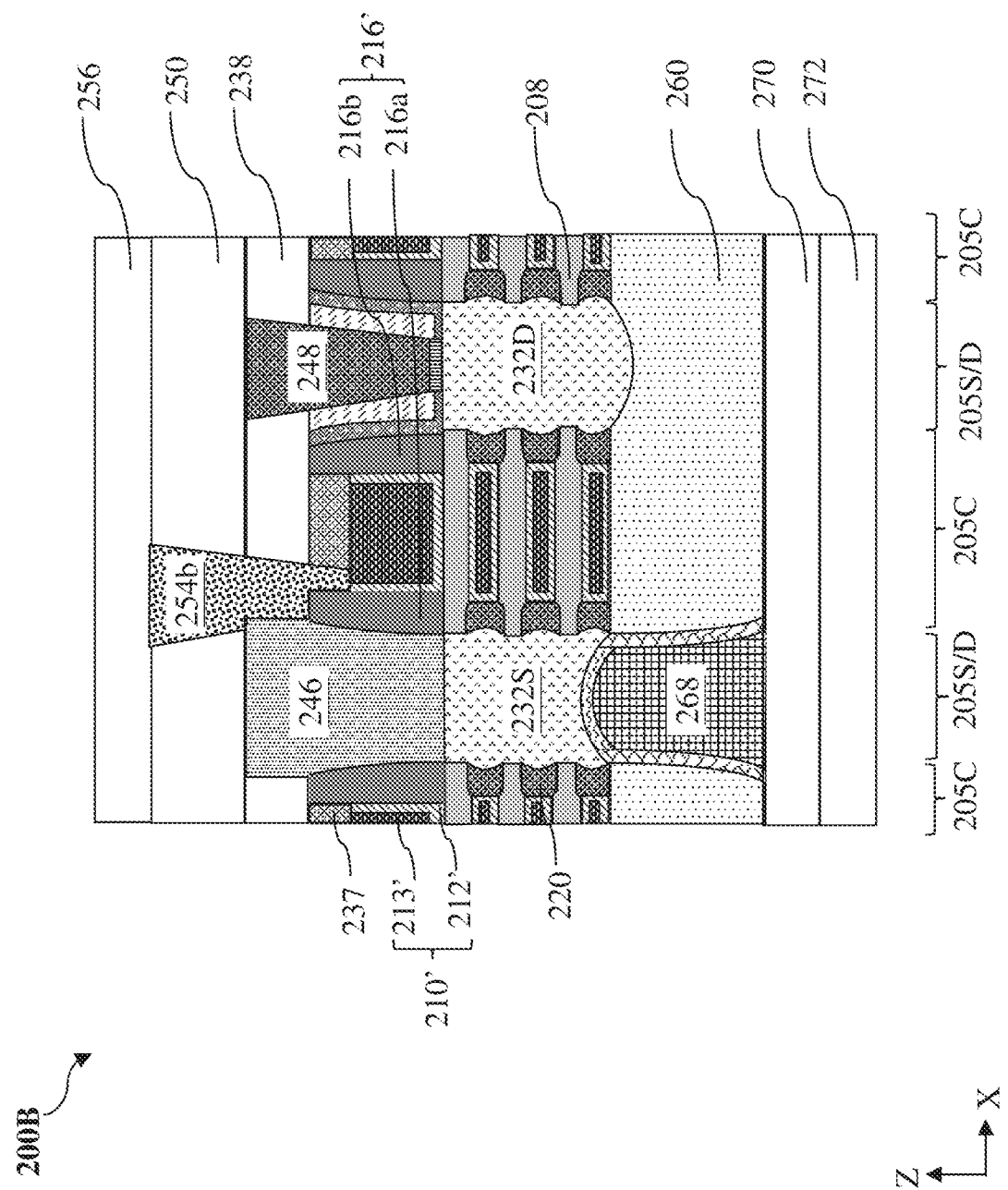
Figure 31:
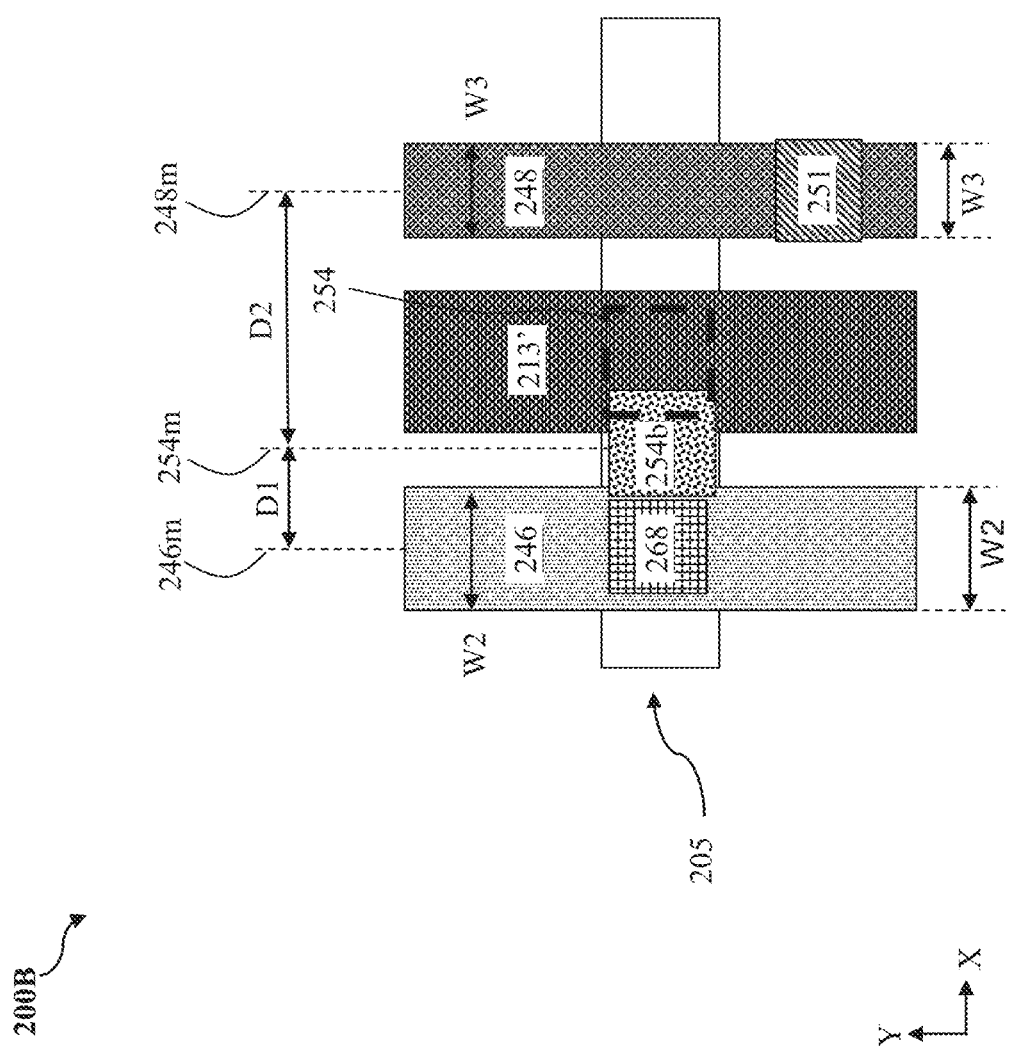

In another embodiment shown in FIG. 30, the workpiece 200B includes a gate contact via 254b. With the increased intentional overlay shift, the gate contact via 254b is not only formed directly on the gate spacer 216a, but also disposed directly on a portion of the dielectric plug 246. FIG. 31 shows an exemplary layout of the workpiece 200A. D2 is further increased comparing to that of the layout in FIG. 29. The parasitic capacitance between the gate contact via 254b and the drain contact 248 in workpiece 200B is further smaller than that of workpiece 200A, and a leakage window is further enlarged.

Figure 32:
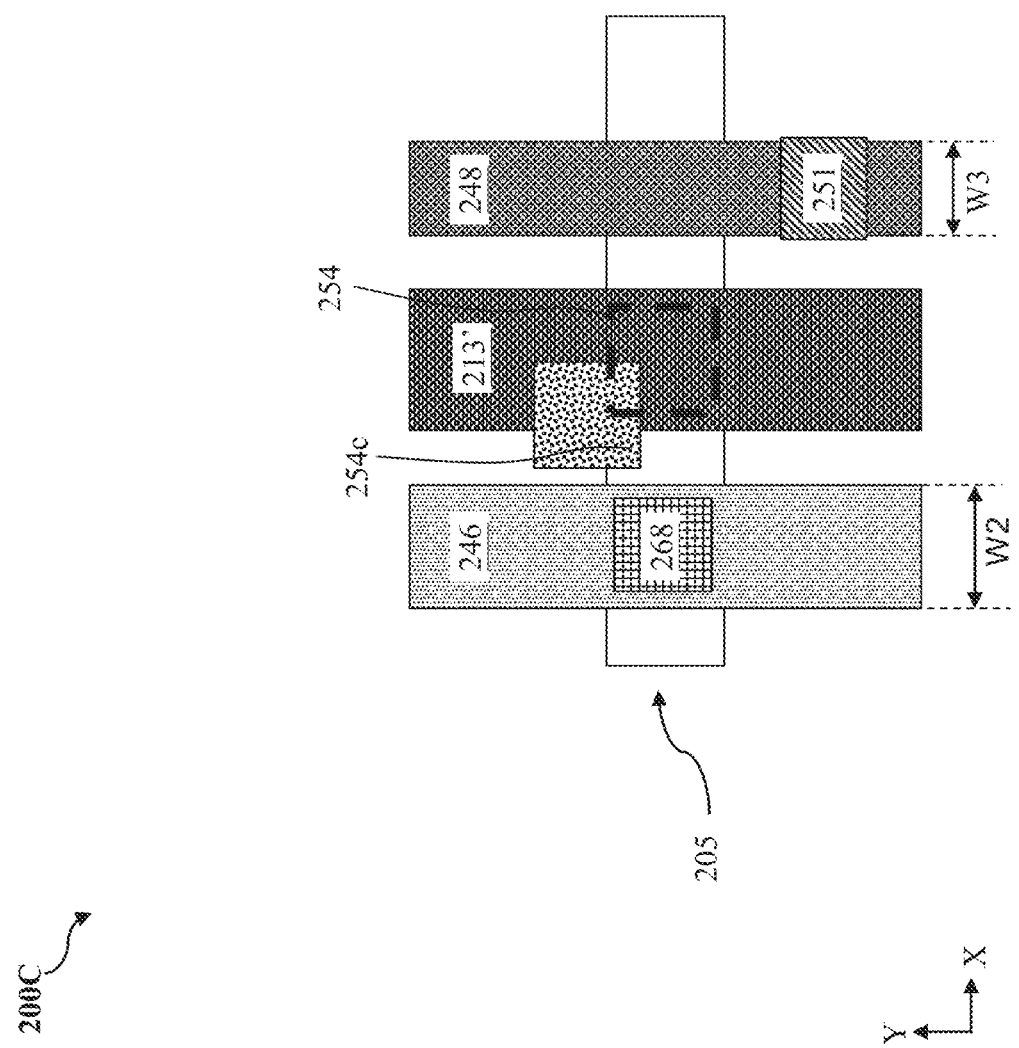
Figure 33:
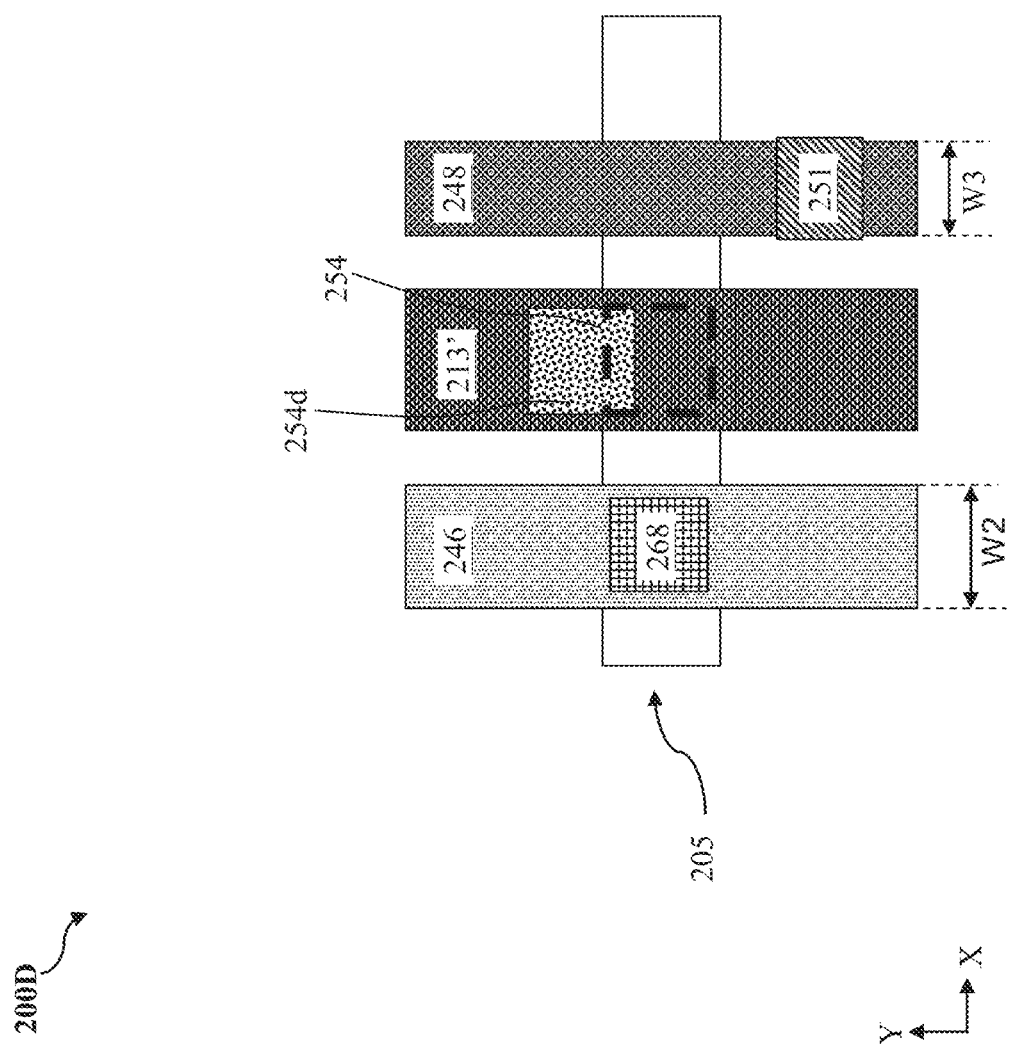

The gate contact via 254b fills a corresponding gate contact via opening. Before filling the corresponding gate contact via opening with the gate contact via 254b, the corresponding gate contact via opening exposes top surfaces of the gate structure 210', the gate spacer 216', and the dielectric plug 246. The formation of this corresponding gate contact via opening may include performing an atomic layer etching (ALE) process to selectively remove the SAC layer 237 to expose a portion of top surface of the gate structure 210' without significantly damaging the gate spacer 216' and the dielectric plug 246. The ALE process may include performing a depositing process. The depositing process may include using a suitable gas such as $C_4F_6$ or other suitable materials. An etching process is followed to etch at least a portion of the SAC layer 237. This etching process may include using a nitrogen-containing gas (e.g., $NF_3$) with other carbon-fluorine-containing gas, or other suitable gas. The depositing process and the etching process may be repeated for several cycles. In the above embodiments described with reference to FIGS. 28-31, the first gate contact via 254 is shifted along the X direction. The first gate contact via 254 can be shifted not only along the X direction, but also along the Y direction. FIGS. 32-33 depict another two alternative embodiments where the gate contact via is shifted along the Y direction. As shown in FIG. 32, the workpiece 200C includes a gate contact via 254c. The gate contact via 254c is in direct contact with the gate structure 210', the spacer 216a, and the bottom ILD layer 236 adjacent to the active region. Comparing to the gate contact via 254b in FIG. 29, the gate contact via 254c is also shifted along the Y direction. As shown in FIG. 33, the workpiece 200D includes a gate contact via 254d. Comparing to the first gate contact via 254 in FIG. 26, the gate contact via 254d is also shifted along the Y direction. The shift along the Y direction may be intentional or unintentional. As described above, aggressive scaling down of IC dimensions has resulted in densely spaced source/drain contact vias and gate contact vias. Comparing to forming a dummy (i.e., non-functional) frontside conductive source contact 248S and a dummy conductive source via 251S, forming the dielectric plug 246 over the source feature 232S increases the process window and the design flexibility of gate contact via. It is further noted that, the shifted gate contact via leads to a reduced contact area between the gate contact via and the gate structure 210'. Thus, the workpiece 200A would have an increased parasitic resistance comparing to the workpiece 200 in FIG. 26. Another embodiment providing a workpiece having an enlarged leakage window and a parasitic resistance substantially equal to that of the workpiece 200 in FIG. 26 would be described in further detail with reference to FIGS. 36-37.

Figure 34:
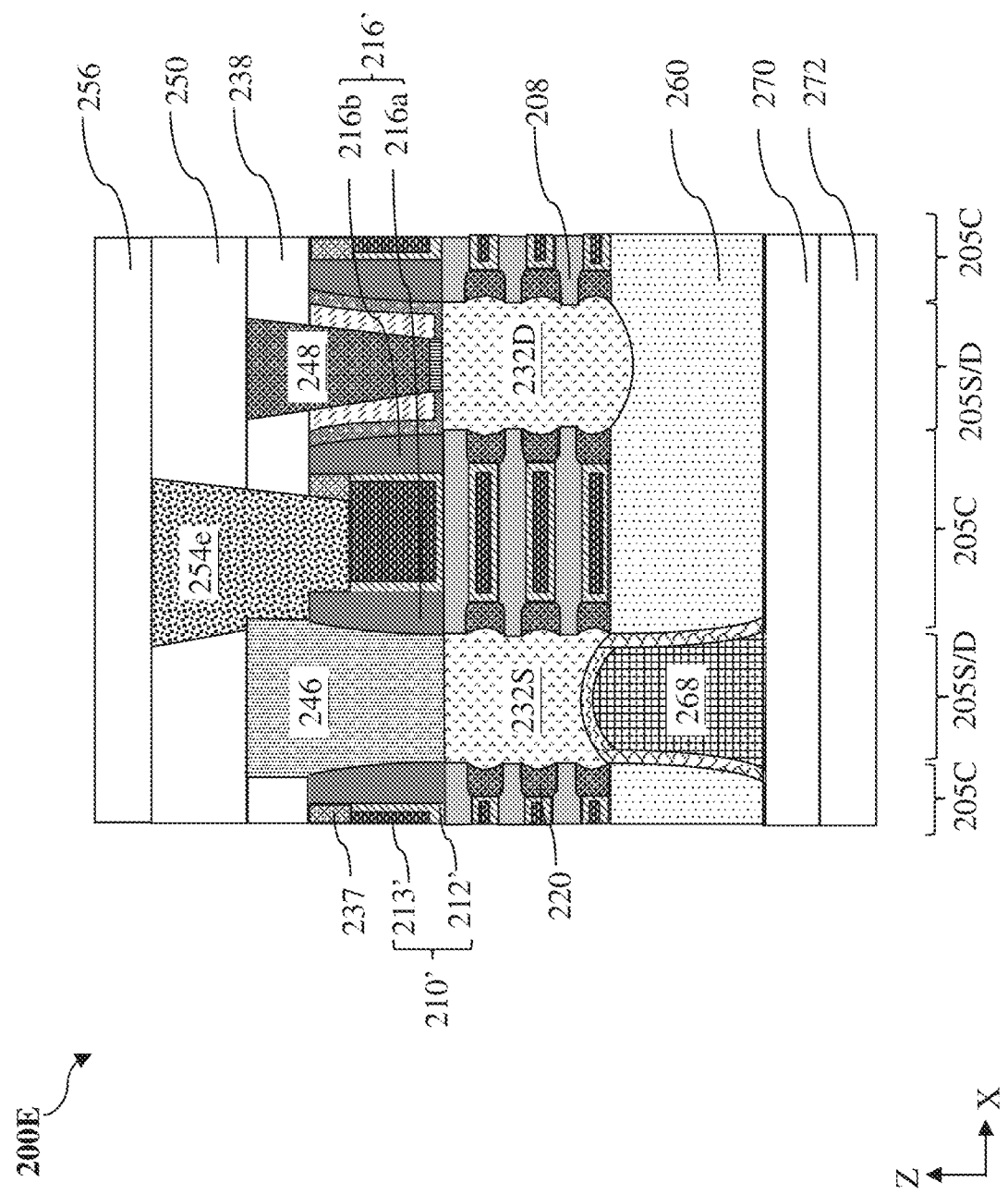
Figure 35:
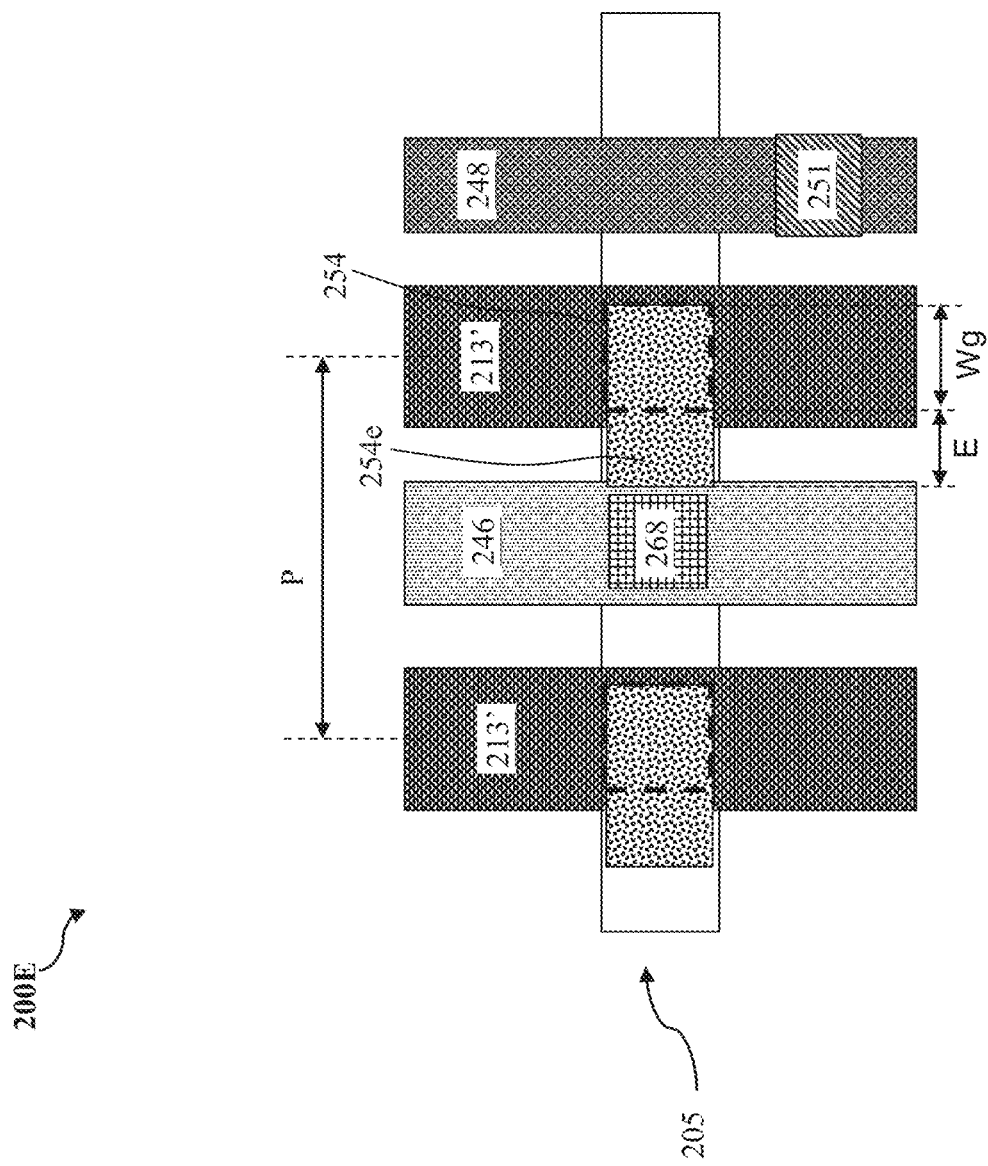

Now referring back to FIG. 27, at block 312b, whether the to-be-fabricated semiconductor device would have a reduced parasitic resistance is determined. If the parasitic resistance would not be reduced, then the method 300 loops back to block 310. If the parasitic resistance would be reduced, then the method 300 proceeds to block 314b where a third photolithography mask would be used to facilitate the formation of a third gate contact via opening. The third photolithography mask would be used to form a single-sided enlarged gate contact via opening comparing to the first photolithography mask. A third gate contact via formed in the third gate contact via opening would have a third configuration. FIGS. 34-35 depict an alternative embodiment where the third photolithography mask is used during the fabrication of a workpiece 200A including a third gate contact via 254e with a third configuration.

As shown in FIG. 34, the workpiece 200E includes a third gate contact via 254e. The side of the first gate contact via 254 (shown in FIGS. 25-26) that is adjacent to the dielectric plug 246 is enlarged to form the third gate contact via 254e. The enlarged third gate contact via 254e is not only formed directly over the gate structure 210', but also disposed directly on the gate spacer 216a and the dielectric plug 246. In other words, the third gate contact via 254e is in direct contact with a portion of a top surface of the dielectric plug 246. FIG. 35 shows an exemplary layout of the workpiece 200E. Due to the enlargement, there is an offset between a center line of the gate structure 210' and a center line of the third gate contact via 254e. As shown in FIG. 35, the left side (which is adjacent to the dielectric plug 246) of the first gate contact via 254 is enlarged to form the third gate contact via 254e. A width difference E of the third gate contact via 254e and the first gate contact via 254 is less than about 0.5*P, where P is the gate structure pitch. The width difference E is such selected that the enlarged third gate contact via 254e would not introduce a significant leakage between the third gate contact via 254e and the other gate structures 210' (e.g., the one on the left side of the dielectric plug 246). In some embodiments, the enlarged third gate contact via 254e may have a width greater than that of the gate structures 210'. Due to the enlargement, a contact area between the third gate contact via 254e and the gate structure 210' is increased comparing to that associated with the first gate contact via 254. Therefore, a parasitic resistance associated with the gate contact via of the workpiece 200E is advantageously reduced comparing to that of the workpiece 200 in FIG. 27 without substantially sacrificing the leakage window.

Figure 36:
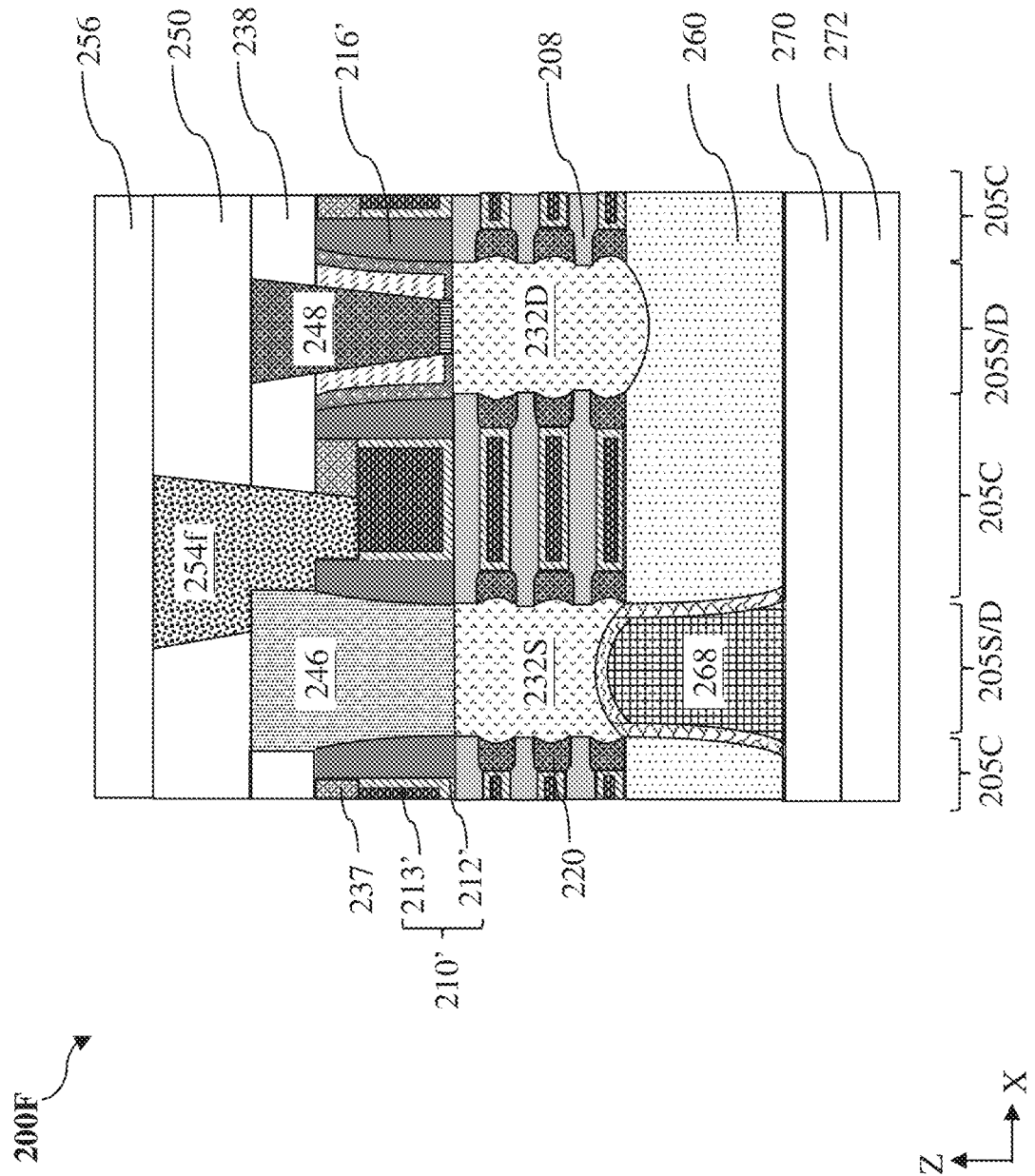
Figure 37:
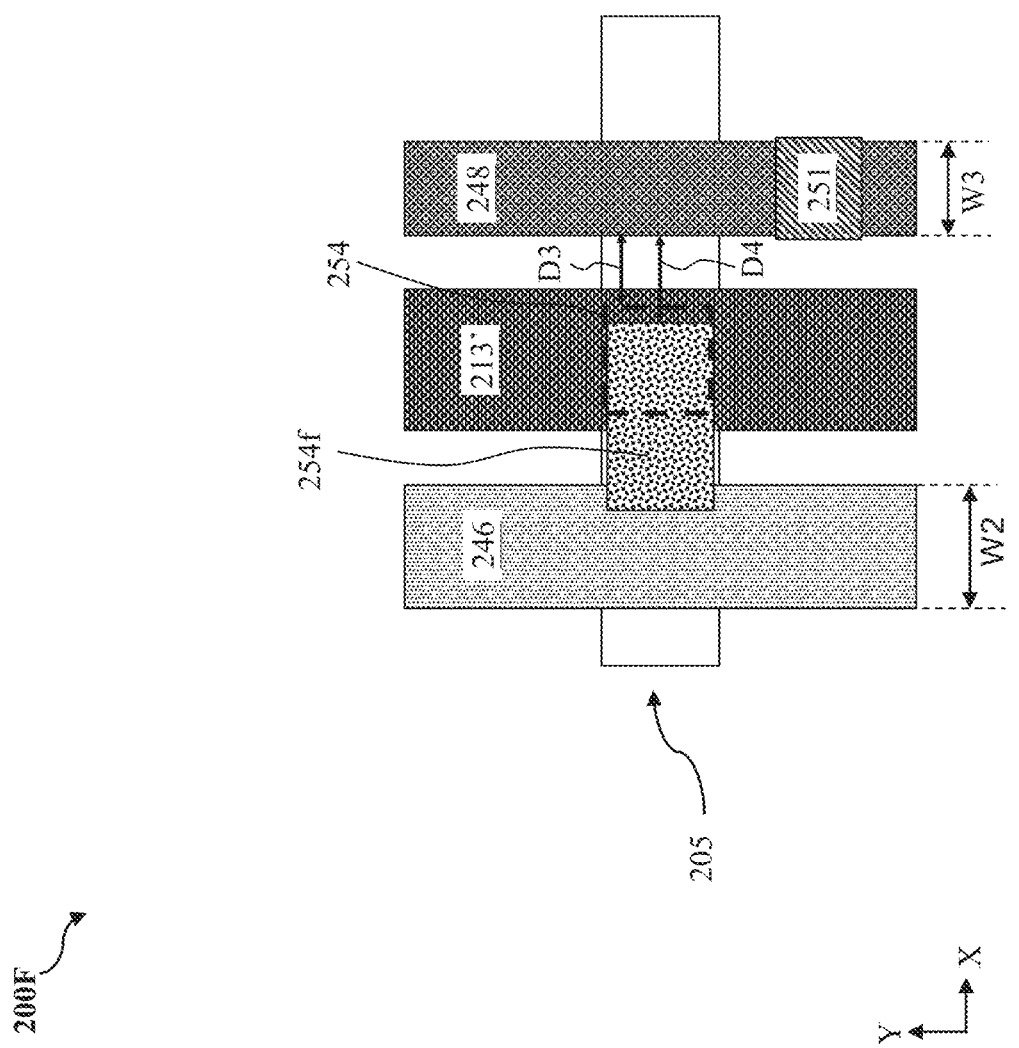

FIG. 36 depicts another embodiment where the leakage window would be enlarged without significantly reducing the contact area (e.g., without significantly increasing the parasitic resistance) between the gate contact via and the gate structure. In this alternative embodiment, the first gate contact via 254 is left-sided enlarged and then shifted towards the dielectric plug 246 to form the gate contact via 254f in the workpiece 200F. FIG. 37 shows an exemplary layout of the workpiece 200F. Due to the shift, the distance between the gate contact via 254f and the drain contact 248 is increased, thus the leakage window is enlarged comparing to that of the workpiece 200 in FIG. 26. In addition, due to the left-sided enlargement, a contact area between the gate contact via 254f and the gate structure 210' is substantially similar to that of the workpiece 200 in FIG. 26. Therefore, the workpiece 200F is provided to have an enlarged leakage window without having significantly changing the parasitic resistance.

Figure 38:
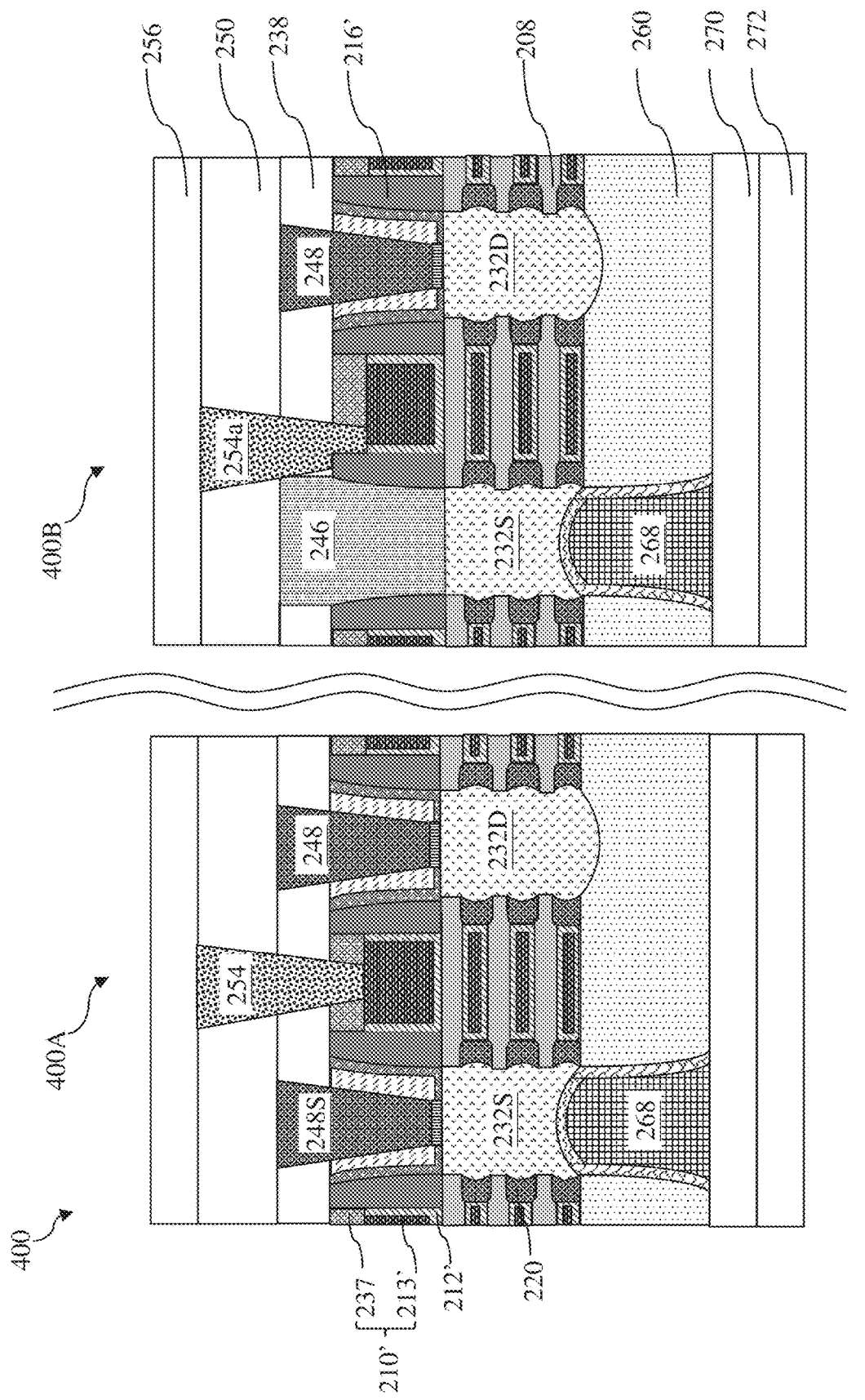
FIGS. 38-39 illustrate fragmentary cross-sectional views of an exemplary workpiece during various fabrication stages in the method of FIG. 1, according to one or more aspects of the present disclosure.

According to the present disclosure, application of method 100 and method 300 may result in different configurations of gate contact vias being used in different device regions. Semiconductor devices in these device regions may be fabricated according to method 100 and method 300 to fit their design requirements. By way of example, FIG. 38 illustrates a workpiece 400 including a first device region 400A and a second device region 400B. The first device region 400A and the second device region 400B may be formed on a same substrate or different substrates. In one example, semiconductor devices in the first device region 400A include a source feature 232S, a frontside source contact 248S over the source feature 232S, and a backside source contact 268 under the source feature 232S. Forming both the frontside source contact 248S and the backside source contact 268 helps providing a more flexible routing. Semiconductor devices in the second device region 400B include a source feature 232S, a dielectric plug 246 over the source feature 232S, and a backside source contact 268 under the source feature 232S. Forming dielectric plug 246 helps increasing the design flexibility of gate contact via. Although the gate contact via 254a is shown in the second device region 400B, it is understood that the gate contact via with other configurations described with reference to method 100 and method 300 are also applicable.

Figure 39:
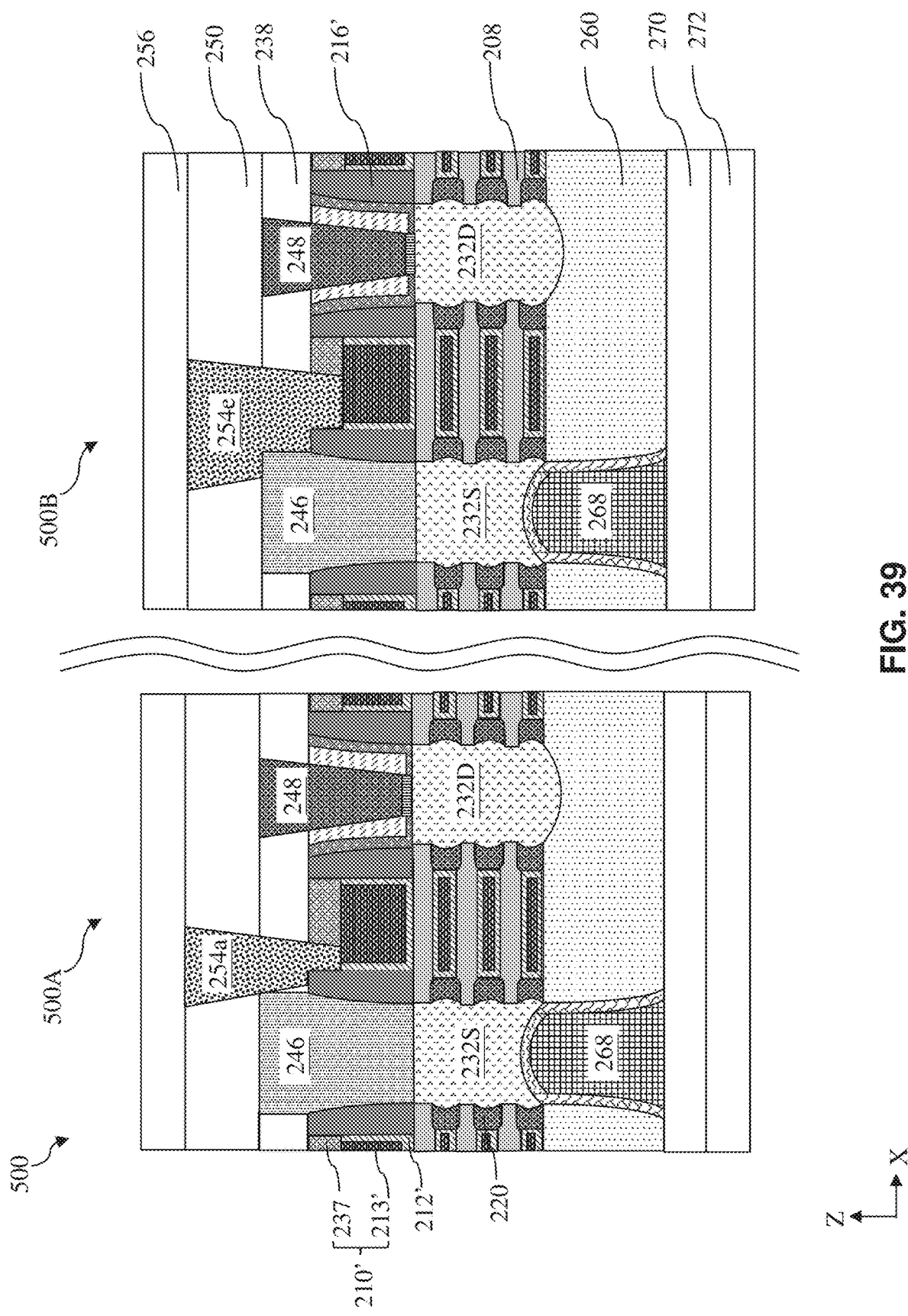

By way of example, FIG. 39 illustrates a workpiece 500 including a first device region 500A and a second device region 500B. In one implementation, semiconductor devices in the first device region 500A include a shifted gate contact via 254a such that the semiconductor devices would have an enlarged leakage window. Semiconductor devices in the second device region 500B include a single-sided enlarged gate contact via 254e such that the semiconductor devices would have a reduced parasitic resistance. Thus, different regions may be applicable for facilitating different functions.

In the above embodiments described with references to FIGS. 1-39, the method 100 and method 300 are described with regard to the dielectric plug on the source feature in multi-bridge-channel (MBC) transistors. It is understood that method 100 and method 300 also apply to a workpiece having a backside drain contact and a dielectric plug on the drain feature. Embodiments of the present disclosure may be applied to other multi-gate devices such as FinFETs.

Embodiments of the present disclosure provide advantages. For example, embodiments of the present disclosure provide methods for forming semiconductor devices with dielectric plug on the source/drain feature. This increases the design flexibility of gate contact vias. That is, the tolerance of processing errors during the mask aligning in the lithography process and/or other inaccuracies for the formation of the gate contact via is increased. In addition, the formation of the dielectric plug also reduces a parasitic capacitance since a frontside source/drain contact is replaced by the dielectric plug. All of these can lead to a better device and yield performances, along with an increased reliability. Embodiments of the present disclosure also provide methods for forming a gate contact via with an intentional overlay shift, which increase the leakage window and reduces the parasitic capacitance between associated with the gate contact via. Overlay may refer to the alignment between various components of different layers in a semiconductor device such as an integrated circuit (IC) chip. Embodiments of the present disclosure also provide methods for forming a single-sided enlarged gate contact via, which increase the contact area between the gate contact via and the gate structure and reduce the parasitic resistance.

The present disclosure provides for many different embodiments. Semiconductor structures and methods of fabrication thereof are disclosed herein. In one exemplary aspect, the present disclosure is directed to a semiconductor device. The semiconductor device includes a first source/drain feature disposed over a first source/drain contact, a second source/drain feature disposed over a backside dielectric layer, a number of channel members each extending between the first and the second source/drain features, a gate structure engaging the number of channel members and disposed over the backside dielectric layer, a bottom dielectric layer disposed directly over the second source/drain feature, a first dielectric layer disposed over the bottom dielectric layer, and an isolation feature extending through the first dielectric layer and disposed directly on the first source/drain feature. A composition of the isolation feature is different than a composition of the bottom dielectric layer, and the first source/drain feature is spaced apart from the first dielectric layer by the isolation feature.

In some embodiments, the semiconductor device may also include a second source/drain contact extending through the first dielectric layer and the bottom dielectric layer and electrically connected to the second source/drain feature, a second dielectric layer disposed over the first dielectric layer, and a gate contact via extending through the second dielectric layer and first dielectric layer and in direct contact with the gate structure.

In some embodiments, the semiconductor device may also include a first gate spacer disposed along a first sidewall of the gate structure and in direct contact with the isolation feature, and a second gate spacer disposed along a second sidewall of the gate structure, the second sidewall opposing the first sidewall. A distance between a first center line of the gate contact via and the second source/drain contact may be greater than a distance between the first center line and the isolation feature.

In some embodiments, the gate contact via may be disposed over and in direct contact with the first gate spacer. In some embodiments, the gate contact via may be disposed over and in direct contact with the isolation feature. In some embodiments, the first center line may be offset from a second center line of the gate structure, the gate structure may have a width W1, and a distance between the first center line of the gate contact via and the second center line of the gate structure may be less than about 0.5*W1.

In some embodiments, the isolation feature may also include a top surface having a first width and a bottom surface having a second width smaller than the first width, the top surface of the isolation feature and a top surface of the first dielectric layer may be coplanar, and the bottom surface of the isolation feature may be in direct contact with the first source/drain feature. In some embodiments, the isolation feature may include silicon nitride, silicon carbide, silicon oxynitride, silicon carbonitride, silicon oxycarbide, silicon oxycarbonitride.

In another exemplary aspect, the present disclosure is directed to a semiconductor structure. The semiconductor structure includes a first gate structure disposed over a channel region of a first active region, a drain feature disposed over a drain region of the first active region, a source feature disposed over a source region of the first active region, a backside source contact disposed under the source feature, an isolation feature disposed on and in contact with the source feature, a drain contact disposed over and electrically coupled to the drain feature, and a gate contact via disposed over and electrically coupled to the first gate structure. A distance between the gate contact via and the drain contact is greater than a distance between the gate contact via and the isolation feature.

In some embodiments, the semiconductor device may also include a first gate spacer disposed along a first sidewall of the first gate structure and adjacent to the source feature, and a second gate spacer disposed along a second sidewall of the first gate structure and adjacent to the drain feature. The gate contact via may be disposed directly over the first gate spacer. In some embodiments, the gate contact via may be disposed directly over and in direct contact with the isolation feature.

In some embodiments, the semiconductor device may also include a second gate structure disposed over a channel region of a second active region, a second source feature disposed over a source region of the second active region, a frontside source contact disposed over the second source feature, and another backside source contact disposed under the second source feature.

In some embodiments, the semiconductor device may also include a second gate structure disposed over a channel region of a second active region. The first gate structure may be spaced apart from the second gate structure by the first gate spacer and the isolation feature.

In some embodiments, the semiconductor device may also include a bottom dielectric layer over the drain feature, a first dielectric layer over the bottom dielectric layer, and a second dielectric layer over the first dielectric layer. The isolation feature may extend through the first dielectric layer and covers a top surface of the source feature.

In some embodiments, the semiconductor device may also include a self-aligned capping layer disposed over the first gate structure. The gate contact via further extends through the self-aligned capping layer. The isolation feature may be also in direct contact with the self-aligned capping layer. In some embodiments, a height/width ratio of the isolation feature may be smaller than a height/width ratio of the drain contact.

In another exemplary aspect, the present disclosure is directed to a method. The method includes receiving a workpiece. The workpiece includes an active region over a substrate, a gate structure disposed over a channel region of the active region, a first source/drain feature disposed over a first source/drain region of the active region and disposed over a semiconductor plug in the substrate, a second source/drain feature disposed over a second source/drain region of the active region, and a first dielectric layer includes a first portion disposed directly over the first source/drain feature and a second portion disposed directly over the second source/drain feature. The method also includes selectively removing the first portion of the first dielectric layer to form an isolation feature opening that exposes the first source/drain feature, forming an isolation feature in the isolation feature opening, a composition of the isolation feature being different than a composition of the first dielectric layer, and replacing the semiconductor plug with a backside source/drain contact.

In some embodiments, the method may also include forming a source/drain contact opening through the first dielectric layer to expose the second source/drain feature, forming a source/drain contact in the source/drain contact opening, forming a second dielectric layer over the first dielectric layer, forming a via opening through the first and the second dielectric layer to expose the gate structure, and forming a contact via in the via opening and in direct contact with the gate structure. A distance between the contact via and the source/drain contact may be greater than a distance between the contact via and the isolation feature.

In some embodiments, the workpiece may also include a first gate spacer disposed along a first sidewall of the gate structure and laterally adjacent to the isolation feature, and a second gate spacer disposed along a second sidewall of the gate structure and laterally adjacent to the source/drain contact. The via opening may also expose at least a portion of the first gate spacer, and the contact via may be also in direct contact with the first gate spacer.

In some embodiments, the via opening may also expose a portion of the isolation feature, and the contact via may be also in direct contact with the isolation feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a gate structure over a channel region protruding from a substrate, and
      a first source/drain feature and a second source/drain feature coupled to the channel region;
   forming a first dielectric structure directly over the first source/drain feature and the second source/drain feature, a top surface of the first dielectric structure is coplanar with a top surface of the gate structure;
   forming a second dielectric structure on the first dielectric structure;
   forming a dielectric feature extending through the second dielectric structure and the first dielectric structure to direct contact the first source/drain feature, a composition of the dielectric feature is different from compositions of the first and second dielectric structures;
forming a first source/drain contact disposed directly under the first source/drain feature and electrically coupled to the first source/drain feature; and
forming a second source/drain contact extending through the second dielectric structure and the first dielectric structure to electrically couple to the second source/drain feature.

2. The method of claim 1, wherein the forming of the first dielectric structure comprises:
conformally depositing a contact etch stop layer over the workpiece;
forming an interlayer dielectric layer on the contact etch stop layer; and
performing a planarization process to remove portions of the contact etch stop layer and interlayer dielectric layer formed over the gate structure.

3. The method of claim 1, wherein the workpiece further comprises a gate spacer extending along a sidewall surface of the gate structure, wherein the dielectric feature is in direct contact with a top surface of the gate spacer.

4. The method of claim 1, wherein the channel region comprises a vertical stack of alternating channel layers and sacrificial layers, the method further comprises:
after the forming of the first dielectric structure, selectively remove the gate structure and selectively removing the sacrificial layers; and
forming a gate stack to wrap around each of the channel layers.

5. The method of claim 4, further comprising: after the forming of the dielectric feature, forming a gate via extending through the second dielectric structure to electrically couple to the gate stack.

6. The method of claim 5, wherein the gate via is vertically overlapped with the dielectric feature.

7. The method of claim 5, wherein, in a top view, a distance between the gate via and the second source/drain contact is greater than a distance between the gate via and the dielectric feature.

8. The method of claim 1, wherein a contact area between the dielectric feature and the first source/drain feature is greater than a contact area between the second source/drain contact and the second source/drain feature.

9. The method of claim 1,
wherein the workpiece further comprises a semiconductor feature disposed immediately under the first source/drain feature and in the substrate, and the forming of the first source/drain contact comprises:
planarizing the substrate to expose a bottom surface of the semiconductor feature;
replacing the substrate with a dielectric material layer;
selectively removing the semiconductor feature to form a backside opening;
forming a silicide layer in the backside opening and in direct contact with the first source/drain feature; and
depositing a conductive material in the backside opening to form the first source/drain contact.

10. The method of claim 1, wherein a top surface of the dielectric feature spans a first width, and a top surface of the second source/drain contact spans a second width less than the first width.

11. A method, comprising:
forming a first dielectric structure over a first source/drain feature formed in a first source/drain recess;
forming a second dielectric structure over the first dielectric structure;
patterning the first dielectric structure and the second dielectric structure to form a first opening exposing an entirety of a top surface of the first source/drain feature;
forming a dielectric feature in the first opening; and
forming a first source/drain contact disposed directly under the first source/drain feature.

12. The method of claim 11,
wherein the patterning of the first dielectric structure and the second dielectric structure further forms a second opening exposing a portion of a top surface of a second source/drain feature, and the method further comprises:
forming a second source/drain contact in the second opening.

13. The method of claim 11, wherein the forming of the first source/drain contact comprises:
after forming the first source/drain recess, performing an etching process to vertically extend the first source/drain recess;
forming a semiconductor plug in a lower portion of the vertically extended first source/drain recess, wherein the first source/drain feature is formed in an upper portion of the vertically extended first source/drain recess and on the semiconductor plug; and
after the forming of the dielectric feature, replacing the semiconductor plug with the first source/drain contact.

14. The method of claim 11, further comprising:
after the forming of the dielectric feature, forming a third dielectric structure on the second dielectric structure;
forming a gate via extending through the third dielectric structure and the second dielectric structure to electrically couple to a gate structure disposed adjacent to the dielectric feature.

15. The method of claim 14, wherein the gate via is partially landed on the dielectric feature.

16. The method of claim 14, wherein, in a top view, a distance between the gate via and the first source/drain contact is greater than a distance between the gate via and the dielectric feature.

17. A method, comprising:
receiving a workpiece comprising:
an active region over a substrate;
a gate structure disposed over a channel region of the active region,
a first source/drain feature disposed over a first source/drain region of the active region and disposed over a semiconductor plug in the substrate;
a second source/drain feature disposed over a second source/drain region of the active region, and
a first dielectric layer comprising a first portion disposed directly over the first source/drain feature and a second portion disposed directly over the second source/drain feature;
selectively removing the first portion of the first dielectric layer to form an isolation feature opening that exposes the first source/drain feature;
forming an isolation feature in the isolation feature opening, a composition of the isolation feature being different than a composition of the first dielectric layer; and
replacing the semiconductor plug with a backside source/drain contact.

18. The method of claim 17, further comprising:
forming a source/drain contact opening through the first dielectric layer to expose the second source/drain feature;

forming a source/drain contact in the source/drain contact opening;

forming a second dielectric layer over the first dielectric layer;

forming a via opening through the first and the second dielectric layer to expose the gate structure; and forming a contact via in the via opening and in direct contact with the gate structure, wherein a distance between the contact via and the source/drain contact is greater than a distance between the contact via and the isolation feature.

19. The method of claim 18, wherein the workpiece further comprises:
- a first gate spacer disposed along a first sidewall of the gate structure and laterally adjacent to the isolation feature, and
- a second gate spacer disposed along a second sidewall of the gate structure and laterally adjacent to the source/drain contact, wherein the via opening further exposes at least a portion of the first gate spacer, and the contact via is further in direct contact with the first gate spacer.

20. The method of claim 18, wherein the via opening further exposes a portion of the isolation feature, and the contact via is further in direct contact with the isolation feature.

\* \* \* \* \*